United States Patent
Joo et al.

(10) Patent No.: US 11,004,507 B2
(45) Date of Patent: **\*May 11, 2021**

(54) METHODS AND SYSTEMS FOR DETECTING DEGRADATION OF RESISTIVE MEMORY DEVICES

(71) Applicant: Samsung Electronics Co., Ltd., Suwon-si (KR)

(72) Inventors: Han-sung Joo, Seoul (KR); Seung-You Baek, Suwon-si (KR); Ki-sung Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 32 days.

This patent is subject to a terminal disclaimer.

(21) Appl. No.: 16/377,420

(22) Filed: Apr. 8, 2019

(65) Prior Publication Data

US 2020/0051628 A1 Feb. 13, 2020

(30) Foreign Application Priority Data

Aug. 7, 2018 (KR) ........................ 10-2018-0092050

(51) Int. Cl.
*G11C 13/00* (2006.01)
*G06F 11/07* (2006.01)
*G11C 11/56* (2006.01)

(52) U.S. Cl.
CPC ........ *G11C 13/0035* (2013.01); *G06F 11/076* (2013.01); *G11C 11/5678* (2013.01);
(Continued)

(58) Field of Classification Search
CPC .................................................. G11C 13/0035
See application file for complete search history.

(56) References Cited

U.S. PATENT DOCUMENTS 7,542,357 B2   6/2009 Sakata et al.
7,679,954 B2   3/2010 Lee et al.
(Continued)

FOREIGN PATENT DOCUMENTS

JP              4545726 B2    9/2010
KR    10-2011-0078727 A      7/2011
(Continued)

OTHER PUBLICATIONS

U.S. Notice of Allowance dated May 8, 2020 for corresponding U.S. Appl. No. 16/377,952.
(Continued)

*Primary Examiner* — Douglas King
(74) *Attorney, Agent, or Firm* — Harness, Dickey & Pierce, P.L.C.

(57) ABSTRACT

A memory controller may detect degradation in accordance with a bit error rate (BER) of the resistive memory device including memory cells. The memory controller may control the memory cells to be programmed to a first resistance state, read the programmed memory cells, and receive the BER of the memory cells generated during a read operation from the resistive memory device. The memory controller may determine a quantity of program cycles of the memory cells based on the BER. The quantity may be determined based on reference to a lookup table indicating a correlation between the BER and the quantity of program cycles.

16 Claims, 20 Drawing Sheets

(52) U.S. Cl.
CPC ........ *G11C 13/004* (2013.01); *G11C 13/0069* (2013.01); *G11C 2013/0045* (2013.01); *G11C 2013/0078* (2013.01)

(56) References Cited

U.S. PATENT DOCUMENTS

| | | |
|---|---|---|
| 7,990,790 B2 | 8/2011 | Lee |
| 8,213,254 B2 | 7/2012 | Choi et al. |
| 8,413,004 B2 | 4/2013 | Franceschini et al. |
| 8,588,010 B2 | 11/2013 | Lee et al. |
| 8,634,225 B2 | 1/2014 | Kang |
| 9,021,227 B2 | 4/2015 | Karpov et al. |
| 9,164,836 B2 | 10/2015 | Guo et al. |
| 9,196,380 B2 | 11/2015 | Liu et al. |
| 9,263,136 B1 | 2/2016 | Zhao et al. |
| 9,396,118 B2 | 7/2016 | Dong |
| 2012/0290781 A1 | 11/2012 | Seo et al. |
| 2013/0191700 A1* | 7/2013 | Griffin .................. G06F 11/076 714/759 |
| 2016/0172034 A1* | 6/2016 | Oh .......................... G06F 12/00 714/763 |

FOREIGN PATENT DOCUMENTS

| | | |
|---|---|---|
| KR | 101071705 B1 | 10/2011 |
| KR | 101780539 B1 | 9/2017 |

OTHER PUBLICATIONS

U.S. Office Action dated Feb. 10, 2020 for corresponding U.S. Appl. No. 16/377,952.
U.S. Appl. No. 16/377,952, filed Apr. 8, 2019.

\* cited by examiner

FIG. 13

| 1rst BER \ VR BER | 0 | 5 | 10 | 15 | 20 | 25 | 30 | 35 | 40 | 45 | 50 | 55 | 60 | 65 | 70 | 75 | 80 | 85 | 90 | 95 | 100 |
|---|---|---|---|---|---|---|---|---|---|---|---|---|---|---|---|---|---|---|---|---|---|
| 0 | NPC | NPC | — | — | — | — | — | — | — | — | — | — | — | — | — | — | — | — | — | NPC | NPC |
| 5 | NPC | NPC | — | — | — | — | — | — | — | — | — | — | — | — | — | — | — | — | — | NPC | NPC |
| 10 | — | — | — | — | — | — | — | — | — | — | — | — | — | — | — | — | — | — | — | — | — |
| 15 | — | — | — | — | — | — | — | — | — | — | — | — | — | — | — | — | — | — | — | — | — |
| 20 | — | — | — | — | — | — | — | — | — | — | — | — | — | — | — | — | — | — | — | — | — |
| 25 | — | — | — | — | — | — | — | — | — | — | — | — | — | — | — | — | — | — | — | — | — |
| 30 | — | — | — | — | — | — | — | — | — | — | — | — | — | — | — | — | — | — | — | — | — |
| 35 | — | — | — | — | — | — | — | — | — | — | — | — | — | — | — | — | — | — | — | — | — |
| 40 | — | — | — | — | — | — | — | — | — | — | — | — | — | — | — | — | — | — | — | — | — |
| 45 | — | — | — | — | — | — | — | — | — | — | — | — | — | — | — | — | — | — | — | — | — |
| 50 | — | — | — | — | — | — | — | — | — | — | — | — | — | — | — | — | — | — | — | — | — |
| 55 | — | — | — | — | — | — | — | — | — | — | — | — | — | — | — | — | — | — | — | — | — |
| 60 | — | — | — | — | — | — | — | — | — | — | — | — | — | — | — | — | — | — | — | — | — |
| 65 | — | — | — | — | — | — | — | — | — | — | — | — | — | — | — | — | — | — | — | — | — |
| 70 | — | — | — | — | — | — | — | — | — | — | — | — | — | — | — | — | — | — | — | — | — |
| 75 | — | — | — | — | — | — | — | — | — | — | — | — | — | — | — | — | — | — | — | — | — |
| 80 | — | — | — | — | — | — | — | — | — | — | — | — | — | — | — | — | — | — | — | — | — |
| 85 | — | — | — | — | — | — | — | — | — | — | — | — | — | — | — | — | — | — | — | — | — |
| 90 | — | — | — | — | — | — | — | — | — | — | — | — | — | — | — | — | — | — | — | — | — |
| 95 | NPC | NPC | — | — | — | — | — | — | — | — | — | — | — | — | — | — | — | — | — | NPC | NPC |
| 100 | NPC | NPC | — | — | — | — | — | — | — | — | — | — | — | — | — | — | — | — | — | NPC | NPC |

NPC: Number of Program Cycles

FIG. 19

NPC: Number of Program Cycles

| I set BER \ VS BER | 0 | 5 | 10 | 15 | 20 | 25 | 30 | 35 | 40 | 45 | 50 | 55 | 60 | 65 | 70 | 75 | 80 | 85 | 90 | 95 | 100 |
|---|---|---|---|---|---|---|---|---|---|---|---|---|---|---|---|---|---|---|---|---|---|
| 0 | NPC | NPC | — | — | — | — | — | — | — | — | — | — | — | — | — | — | — | — | — | NPC | NPC |
| 5 | NPC | NPC | — | — | — | — | — | — | — | — | — | — | — | — | — | — | — | — | — | NPC | NPC |
| 10 | — | — | — | — | — | — | — | — | — | — | — | — | — | — | — | — | — | — | — | — | — |
| 15 | — | — | — | — | — | — | — | — | — | — | — | — | — | — | — | — | — | — | — | — | — |
| 20 | — | — | — | — | — | — | — | — | — | — | — | — | — | — | — | — | — | — | — | — | — |
| 25 | — | — | — | — | — | — | — | — | — | — | — | — | — | — | — | — | — | — | — | — | — |
| 30 | — | — | — | — | — | — | — | — | — | — | — | — | — | — | — | — | — | — | — | — | — |
| 35 | — | — | — | — | — | — | — | — | — | — | — | — | — | — | — | — | — | — | — | — | — |
| 40 | — | — | — | — | — | — | — | — | — | — | — | — | — | — | — | — | — | — | — | — | — |
| 45 | — | — | — | — | — | — | — | — | — | — | — | — | — | — | — | — | — | — | — | — | — |
| 50 | — | — | — | — | — | — | — | — | — | — | — | — | — | — | — | — | — | — | — | — | — |
| 55 | — | — | — | — | — | — | — | — | — | — | — | — | — | — | — | — | — | — | — | — | — |
| 60 | — | — | — | — | — | — | — | — | — | — | — | — | — | — | — | — | — | — | — | — | — |
| 65 | — | — | — | — | — | — | — | — | — | — | — | — | — | — | — | — | — | — | — | — | — |
| 70 | — | — | — | — | — | — | — | — | — | — | — | — | — | — | — | — | — | — | — | — | — |
| 75 | — | — | — | — | — | — | — | — | — | — | — | — | — | — | — | — | — | — | — | — | — |
| 80 | — | — | — | — | — | — | — | — | — | — | — | — | — | — | — | — | — | — | — | — | — |
| 85 | — | — | — | — | — | — | — | — | — | — | — | — | — | — | — | — | — | — | — | — | — |
| 90 | — | — | — | — | — | — | — | — | — | — | — | — | — | — | — | — | — | — | — | — | — |
| 95 | NPC | NPC | — | — | — | — | — | — | — | — | — | — | — | — | — | — | — | — | — | NPC | NPC |
| 100 | NPC | NPC | — | — | — | — | — | — | — | — | — | — | — | — | — | — | — | — | — | NPC | NPC |

METHODS AND SYSTEMS FOR DETECTING DEGRADATION OF RESISTIVE MEMORY DEVICES

CROSS-REFERENCE TO RELATED APPLICATION

This application claims the benefit, under 35 U.S.C. § 119, of Korean Patent Application No. 10-2018-0092050, filed on Aug. 7, 2018, in the Korean Intellectual Property Office, the disclosure of which is incorporated herein in its entirety by reference.

BACKGROUND

The inventive concepts relate to non-volatile memory devices, and more particularly, to methods and systems for detecting degradation of resistive memory devices.

As non-volatile memory devices, resistive memory devices such as phase change RAM (PRAM), resistive RAM (RRAM), magnetic RAM (MRAM), and the like are known. Resistive memory devices use variable resistive devices, configured to store data by according a change in a resistance state, as memory cells. Resistive memory devices include cross-point type resistive memory devices that include one or more memory cells at the intersections of a plurality of bit lines and a plurality of word lines. A resistive memory device may access a memory cell therein by applying voltage to both ends of the memory cell and may store a logic "1 (set data)" (a low resistance state) or a logic "0 (reset data)" (a high resistance state) with respect to a threshold resistance of the memory cell.

An important criterion in the resistive memory device is a retention time at which data may be preserved and an endurance level at which a normal operation may be performed without being worn out when writing data. Data retention and endurance may depend on environments that degrade the characteristics of memory cells, such as high temperature and/or program cycles. The degradation of the memory cells may reduce a sensing margin between the set data of logic "1" and the reset data of logic "0". As a result, the sensing of the set data or the reset data may become more uncertain or slower or may cause multiple bit errors. The degradation of the resistive memory device degrades the performance of a storage device including the resistive memory device.

SUMMARY

The inventive concepts provide methods and systems for detecting degradation of resistive memory devices.

According to an aspect of the inventive concepts, a method of operating a memory controller, where the memory controller is configured to control a resistive memory device, and the resistive memory device includes a plurality of memory cells, may include controlling the resistive memory device to program the plurality of memory cells to a first resistance state, controlling the resistive memory device to read the plurality of programmed memory cells, receiving, from the resistive memory device, a bit error rate (BER) of the memory cells generated during a read operation, and determining a quantity of program cycles of the memory cells based on the BER.

According to some example embodiments, a resistive memory device may include a memory cell array including a plurality of memory cells, a write circuit configured to program the plurality of memory cells to a first resistance state, a read circuit configured to read the plurality of programmed memory cells, and a control circuitry configured to output, to an outside of the resistive memory device, a bit error rate (BER) of the memory cells generated during a read operation, to enable a quantity of program cycles of the plurality of memory cells to be determined based on the BER.

According to some example embodiments, a memory system may include a resistive memory device and a memory controller configured to control the resistive memory device. The resistive memory device may include a memory cell array including a plurality of memory cells, a write circuit configured to program the plurality of memory cells to a first resistance state, a read circuit configured to read the plurality of programmed memory cells, and a control circuitry configured to provide a bit error rate (BER) of the plurality of memory cells generated during a read operation. The control circuitry may be configured to provide the BER to the memory controller.

BRIEF DESCRIPTION OF THE DRAWINGS

Example embodiments of the inventive concepts will be more clearly understood from the following detailed description taken in conjunction with the accompanying drawings in which:

FIGS. 10, 11, 12, and 13 are diagrams illustrating methods of detecting degradation of a memory device according to some example embodiments of the inventive concepts;

FIGS. 16, 17, 18, and 19 are diagrams illustrating methods of detecting degradation of a memory device according to some example embodiments of the inventive concepts;

DETAILED DESCRIPTION OF THE EMBODIMENTS

Figure 1:
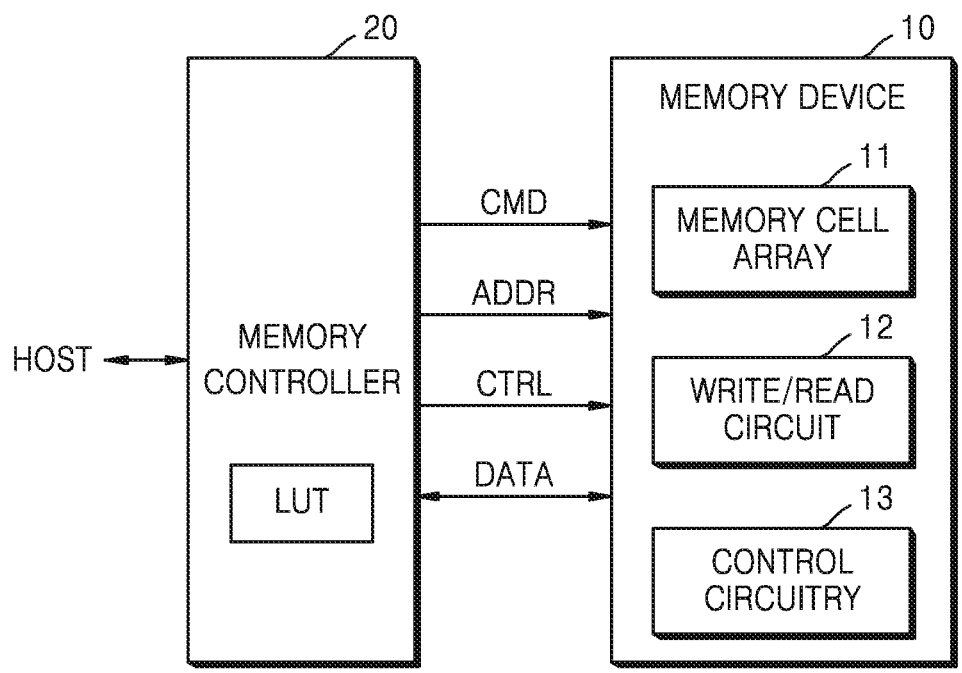
FIG. 1 is a block diagram illustrating a memory system according to some example embodiments of the inventive concepts.

FIG. 1 is a block diagram illustrating a memory system 1 according to some example embodiments of the inventive concepts. The memory system 1 may be included in an electronic device, a computing device, or the like.

Referring to FIG. 1, the memory system 1 may include a memory device 10 and a memory controller 20. The memory controller 20 may be implemented by one or more instances of circuitry, including an instance of processing circuitry (e.g., a processor device). The memory device 10 may include a memory cell array 11, a write/read circuit 12, and a control circuitry 13. It will be understood that the memory device 10 as described herein may be a resistive memory device.

The memory controller 20 may control the memory device 10 to read data stored in the memory device 10 or write data to the memory device 10 in response to a read/write request from a host HOST. The memory controller 20 may control program (e.g., write) and read operations on the memory device 10 by providing an address ADDR, a command CMD and a control signal CTRL to the memory device 10. Data DATA for the program operation and read data DATA may be transmitted and received between the memory controller 20 and the memory device 10.

Although not shown, the memory controller 20 may include RAM, a processing unit, a host interface, a memory interface, ROM, or a non-volatile memory. The RAM may be used as an operation memory of the processing unit. The processing unit may control an operation of the memory controller 20. The host interface may include a protocol for performing data exchange between the host HOST and the memory controller 20. For example, the memory controller 20 may be configured to communicate with the host HOST through at least one of various interface protocols such as USB, MMC, PCI-E, Advanced Technology Attachment (ATA), Serial-ATA, Parallel-ATA, SCSI, ESDI, Integrated Drive Electronics (IDE), and the like.

The memory controller 20 may quickly detect a degradation degree of the memory device 10 with reference to a lookup table LUT. The lookup table LUT may be stored in the memory controller 20. The lookup table LUT may be set to a ratio of the number of program cycles and an error bit rate (BER) of the memory device 10. The lookup table LUT may indicate the correlation between a BER according to a plurality of reset read voltage levels and/or a BER according to a plurality of reset write current levels and the number of program cycles. Alternatively, the lookup table LUT may indicate the correlation between a BER according to a plurality of set read voltage levels and/or a BER according to a plurality of set write current levels and the number of program cycles. The lookup table LUT may be stored in ROM or a non-volatile memory.

The memory cell array 11 may include a plurality of memory cells arranged in regions where a plurality of first signal lines and a plurality of second signal lines cross each other. In some example embodiments, the plurality of first signal lines may be a plurality of bit lines, and the plurality of second signal lines may be a plurality of word lines. In some example embodiments, the plurality of first signal lines may be a plurality of word lines, and the plurality of second signal lines may be a plurality of bit lines. In some example embodiments, the memory cells of the memory cell array 11 include one or more multi-level cells. In some example embodiments, the memory cells of the memory cell array 11 include one or more single-level cells.

In some example embodiments, the plurality of memory cells may include resistive memory cells or resistive memory cells including a variable resistive element having a variable resistance. For example, when the variable resistance element is a phase change material (GST, Ge—Sb—Te) and the resistance varies with temperature, the memory device 10 may be PRAM. In another example, when the variable resistive element includes an upper electrode, a lower electrode, and a complex metal oxide therebetween, the memory device 10 may be RRAM. As another example, when the variable resistance element includes an upper electrode of a magnetic material, a lower electrode of a magnetic material, and a dielectric material therebetween, the memory device 10 may be MRAM.

The write/read circuit 12 may program the memory cells and read the programmed memory cells. The write/read circuit 12 may repeatedly program the memory cells to one data state and read the programmed memory cells. The write/read circuit 12 may perform a program operation by applying a plurality of write currents to the memory cells and perform a read operation of reading the programmed memory cells using a read voltage. The plurality of write currents may include a minimum write current required to cause phase change layers of the memory cells to induce a phase change. Alternatively, the write/read circuit 12 may perform a program operation by applying the minimum write current required to cause phase change layers of the memory cells to induce a phase change to the memory cells and perform a read operation of reading the programmed memory cells using a plurality of read voltages.

The control circuitry 13 may count the BER of the memory cells generated during the read operation. The control circuitry 13 may provide the BER to the memory controller 20. The control circuitry 13 may provide the memory controller 20 with a BER according to a plurality of write currents and/or a BER according to a plurality of read voltages.

The memory controller 20 and the memory device 10 may be integrated into one semiconductor device. For example, the memory controller 20 and the memory device 10 may be integrated into one semiconductor device to configure a memory card. For example, the memory controller 20 and the memory device 10 may be integrated into a single semiconductor device to configure a PC card (PCMCIA), a compact flash card (CF), a smart media card (SM/SMC), a memory stick, (MMC, RS-MMC, MMCmicro), an SD card (SD), miniSD, microSD), universal flash memory (UFS), and the like. As another example, the memory controller 20 and the memory device 10 may be integrated into a single semiconductor device to configure a solid state disk/drive (SSD).

Figure 2:
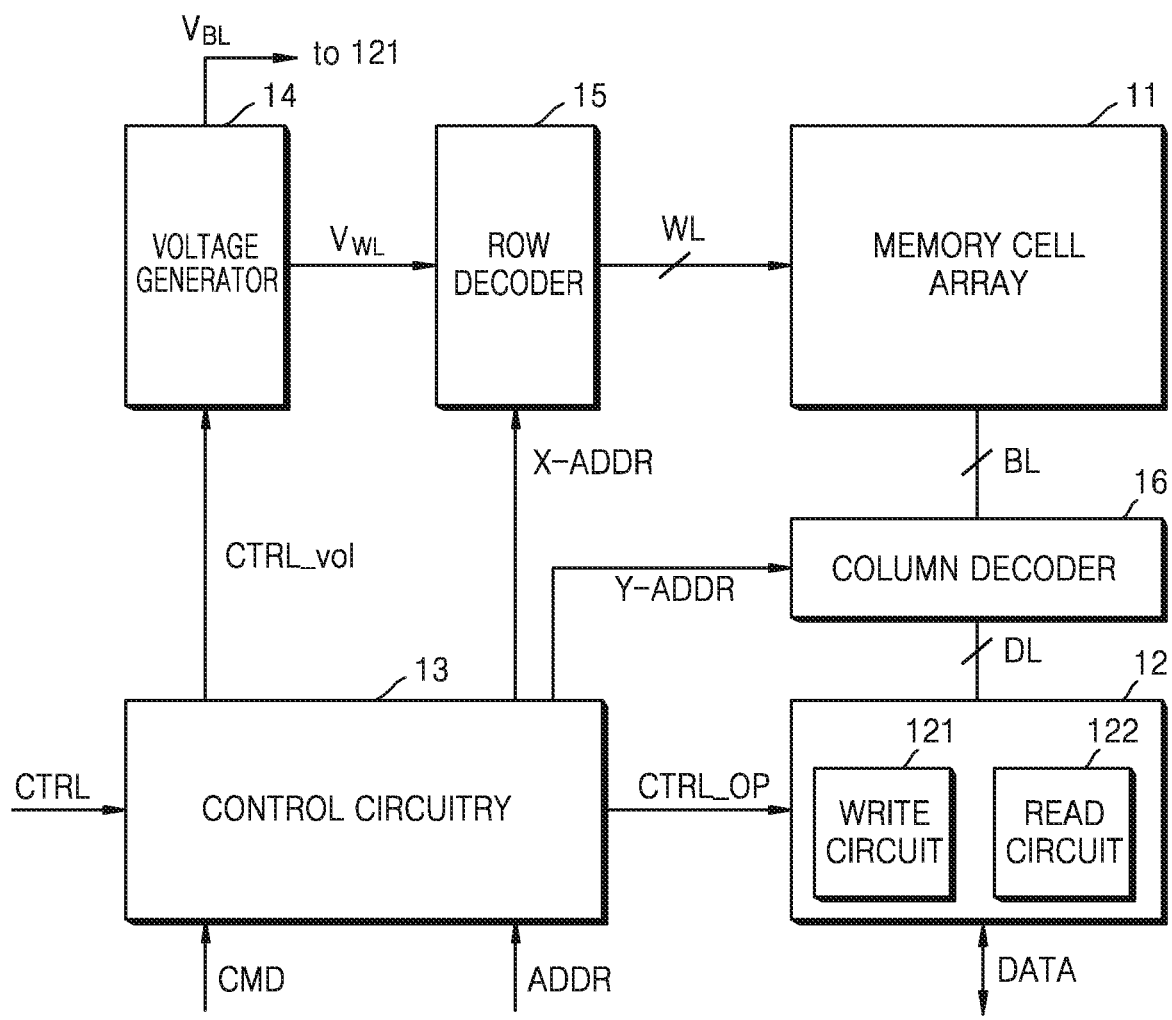
FIG. 2 is a block diagram illustrating a memory device included in the memory system of FIG. 1.

FIG. 2 is a block diagram illustrating the memory device 10 included in the memory system 1 of FIG. 1.

Referring to FIG. 2, the memory device 10 may include a memory cell array 11, a write/read circuit 12, a control circuitry 13, a voltage generator 14, a row decoder 15 and a column decoder 16. The write/read circuit 12 may include a write circuit 121 and a read circuit 122. The row decoder 15 may be referred to herein as a row decoder circuit. The column decoder 16 may be referred to herein as a column decoder circuit.

The memory cell array 11 may be connected to a plurality of first signal lines and a plurality of second signal lines and may include a plurality of memory cells respectively disposed in regions where the plurality of first signal lines and the plurality of second signal lines cross each other. Hereinafter, some example embodiments of the inventive concepts will be described by taking a case where the plurality of first signal lines are bit lines BL and the plurality of second signal lines are word lines WL.

Figure 3:
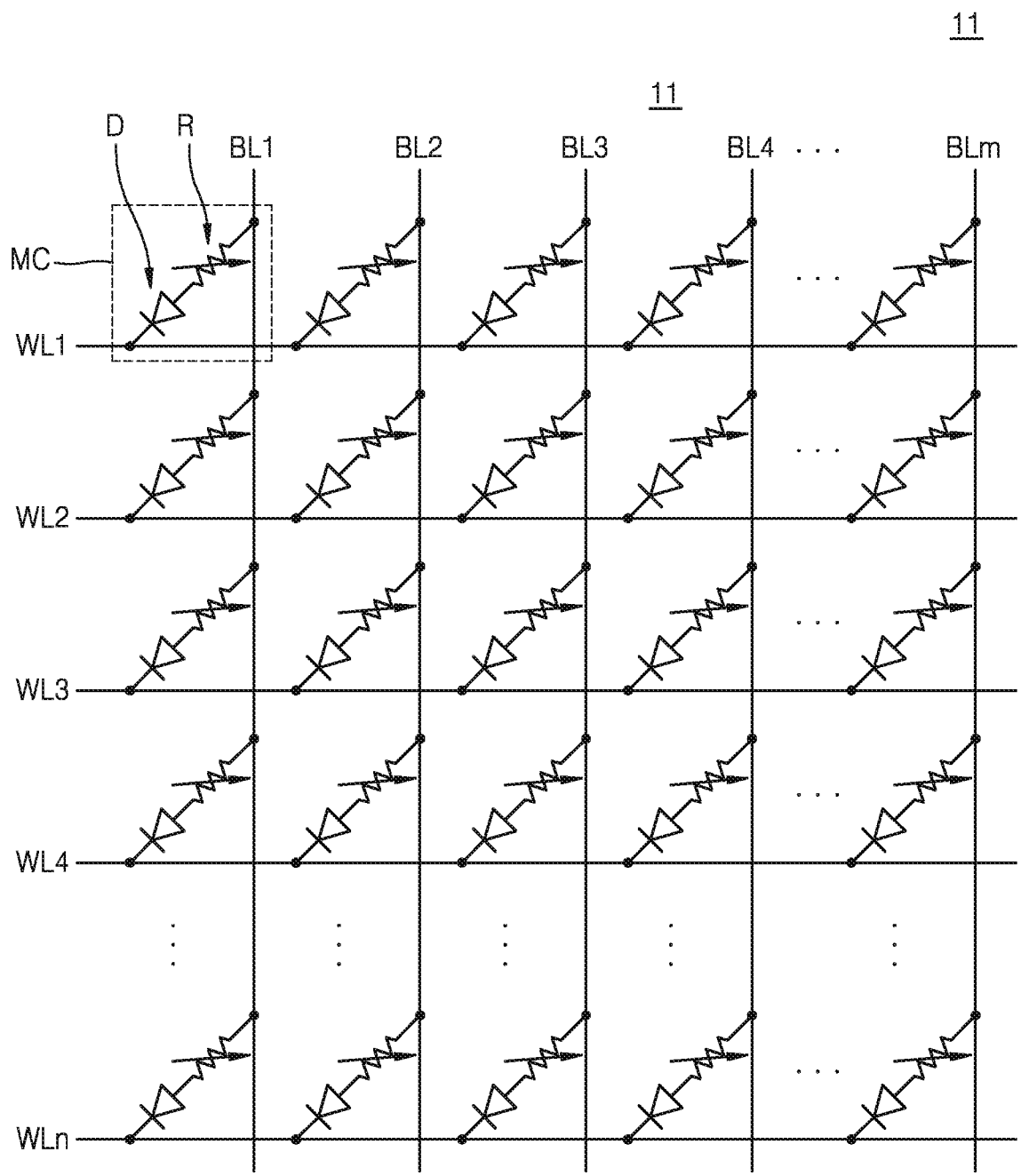
FIG. 3 is a detailed circuit diagram illustrating a memory cell array of FIG. 2.

The memory cell array 11 may be a two-dimensional memory cell array of a horizontal structure and may include a plurality of word lines WL1 to WLn, a plurality of bit lines BL1 to BLm, and a plurality of memory cells MC as shown in FIG. 3. The memory cell array 11 may include a plurality of memory blocks. Each memory block may have a plurality of memory cells arranged in rows and columns. Here, the number of word lines WL, the number of bit lines BL, and the number of memory cells MC may be variously changed according to some example embodiments. However, the inventive concepts is not limited thereto, and in some example embodiments, the memory cell array 11 may be a three-dimensional memory cell array of a vertical structure.

According to some example embodiments, each of the plurality of memory cells MC may include a variable resistance element R and a selection element D. Here, the variable resistance element R may be referred to as a variable resistance material, and the selection element D may be referred to as a switching element.

In some example embodiments, the variable resistance element R may be connected between one of the plurality of bit lines BL1 to BLm and the selection element D and the selection element D may be connected between the variable resistance element R and one of the plurality of word lines WL1 through WLn. However, the inventive concepts are not limited thereto, and the selection element D may be connected between one of the plurality of bit lines BL1 to BLm and the variable resistance element R, and the variable resistance element R may be connected to the selection element D and one of the plurality of word lines WL1 to WLn.

The selection element D may be connected between any one of the plurality of word lines WL1 to WLn and the variable resistive element R and may control a current supply to the variable resistive element R according to voltages applied to the connected word line and bit line. In FIG. 3, the selection element D is shown as a diode, but this is only an example embodiment of the inventive concepts, and in some example embodiments, the selection element D may be changed to another switchable element.

Figure 4A:
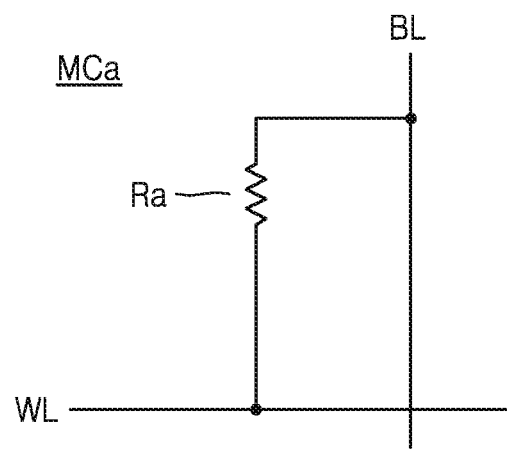
FIGS. 4A, 4B, 4C, and 4D are circuit diagrams illustrating modifications of a memory cell of FIG. 3.

Modifications of the memory cell MC may be implemented as shown in FIGS. 4A, 4B, 4C, and 4D. In FIG. 4A, a memory cell MCa may include a variable resistive element Ra, and the variable resistive element Ra may be connected to the bit line BL and the word line WL. The memory cell MCa may store data according to voltages applied to the bit line BL and the word line WL, respectively.

Figure 4B:
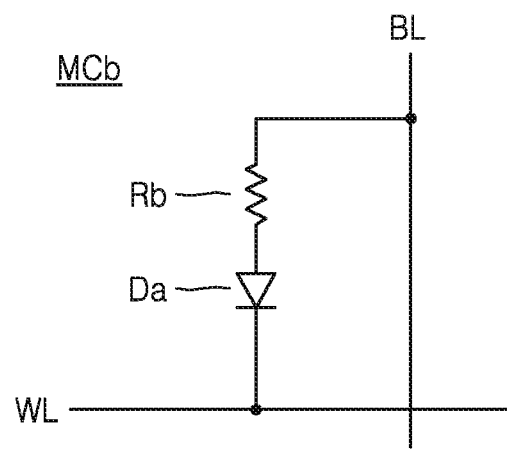

In FIG. 4B, a memory cell MCb may include a variable resistive element Rb and a unidirectional diode Da. The variable resistive element Rb may include a resistive material for storing data. The unidirectional diode Da may be a selection element, that is, a switching element, that supplies or blocks current to the variable resistive element R according to bias of the word line WL and the bit line BL. The unidirectional diode Da may be connected between the variable resistive element Rb and the word line WL and the variable resistive element R may be connected between the bit line BL and the unidirectional diode Da. Positions of the unidirectional diode Da and the variable resistive element R may be switched with each other.

In some example embodiments, the unidirectional diode Da may be a PN junction or a PIN junction diode, an anode of the unidirectional diode Da may be connected to the variable resistive element Rb, and a cathode of the unidirectional diode Da may be connected to one of the plurality of word lines WL1 to WLn. At this time, when the voltage difference between the anode of the unidirectional diode Da and the cathode is greater than a threshold voltage of the unidirectional diode Da, the unidirectional diode Da may be turned on and thus, current may be supplied to the variable resistance element Ra.

Figure 4C:
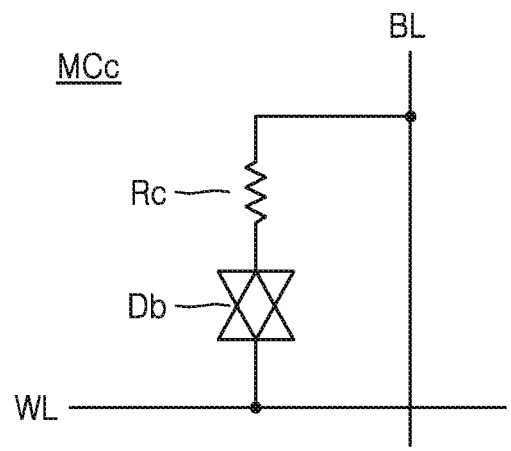

In FIG. 4C, a memory cell MCc may include a variable resistive element Rc and a bi-directional diode Db. The variable resistive element Rc may include a resistive material for storing data. The bidirectional diode Db may be connected between the variable resistive element R and the word line WL and the variable resistive element Rc may be connected between the bit line BL and the bidirectional diode Db. Positions of the bidirectional diode Db and the variable resistive element Rc may be switched with each other. The leakage current flowing in a non-selected resistance cell may be blocked through the bidirectional diode Db.

Figure 4D:
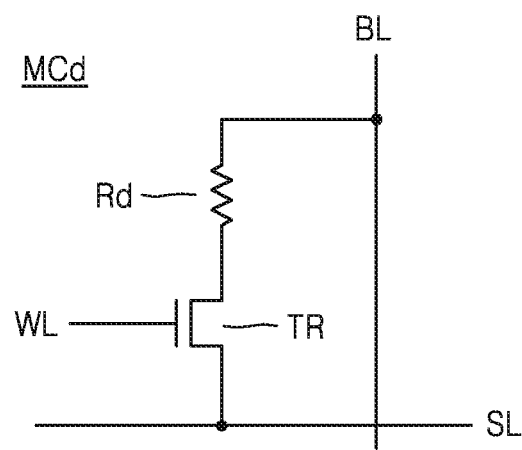

In FIG. 4D, a memory cell MCd may include a variable resistive element Rd and a transistor TR. The transistor TR may be a selection element, that is, a switching element, which supplies or blocks current to the variable resistive element Rd according to the voltage of the word line WL. The transistor TR may be connected between the variable resistive element Rd and the word line WL and the variable resistive element R may be connected between the bit line BL and the transistor TR. Positions of the transistor TR and the variable resistive element Rd may be switched with each other. The memory cell MCd may be selected or unselected depending on whether the transistor TR driven by the word line WL is turned on or off.

Referring again to FIG. 2, the write circuit 121 may be connected to the selected bit line BL and provide a program current to the selected memory cell MC to perform a program operation (i.e., a write operation), thereby inputting data DATA to be stored in the memory cell array 11. Here, the program current may be referred to as a write current.

The write circuit 121 may perform a write operation to the memory cells MC when a write command is received from the memory controller 20. The write circuit 121 may perform a reset write operation of programming the memory cells MC in a direction in which the resistance of the memory cells MC increases. Also, the write circuit 121 may perform a set write operation of programming the memory cells MC in a direction in which the resistance of the memory cells MC is reduced.

In some example embodiments, the write circuit 121 may provide the minimum reset write current necessary for the memory cells MC to change to a high resistance state to program the memory cells MC to reset data of the high resistance state. Alternatively, the write circuit 121 may provide a plurality of reset write currents to the memory cells MC to program the memory cells MC to reset data of the high resistance state. The plurality of reset write currents may include the minimum reset write current necessary for the memory cells MC to change to the high resistance state.

In some example embodiments, the write circuit 121 may provide the minimum set write current necessary for the memory cells MC to change to a low resistance state to program the memory cells MC to set data of the low resistance state. Alternatively, the write circuit 121 may provide a plurality of set write currents to the memory cells MC to program the memory cells MC to set data of the low resistance state. The plurality of set write currents may include the minimum set write current necessary for the memory cells MC to change to the low resistance state.

The read circuit 122 may be connected to the selected bit line BL to read the data DATA stored in the selected memory cell MC. The read circuit 122 may perform a read operation on the memory cell MC when a read command is received from the memory controller 20. The read circuit 122 may read the data of each of the memory cells MC and provide a read result to the control circuitry 13.

In some example embodiments, the read circuit 122 may use a plurality of reset read voltages to perform the read operation on the memory cells MC programmed to the minimum reset write current. Alternatively, the read circuit 122 may use the reset read voltage to perform the read operation on the memory cells MC programmed to a plurality of reset write currents.

In some example embodiments, the read circuit 122 may use a plurality of set read voltages to perform the read operation on the memory cells MC programmed to the minimum set write current. Alternatively, the read circuit 122 may perform the read operation on the memory cells MC programmed to a plurality of set write currents by using the set read voltage.

The control circuitry 13 may output various control signals CTRL_OP. CTRL_VOL for writing the data DATA to the memory cell array 11 or reading the data DATA from the memory cell array 11 based on the command CMD, the address ADDR and the control signal CTRL received from the memory controller 20. The control circuitry 13 may provide the operation control signal CTRL_OP to the write/read circuit 12. Further, the control circuitry 13 may provide the voltage control signal CTRL_VOL to the voltage generator 14. Further, the control circuitry 13 may provide a row address X_ADDR to the row decoder 15 and provide a column address Y_ADDR to the column decoder 16.

The control circuitry 13 may control the same data to be repeatedly programmed on the memory cells MC in all or some of the memory blocks in the memory cell array 11.

In some example embodiments, the control circuitry 13 may control the reset data to be programmed in the memory cells MC of the memory block and store the number of reset data bits programmed in a memory block region. The control circuitry 13 may compare the number of programmed reset data bits with the number of reset data bits read through the read circuit 122 and output a difference as a BER. The control circuitry 13 may provide the memory controller 20 with a BER for memory cells programmed to the plurality of reset write currents and/or a BER for memory cells read with levels of the plurality of reset read voltages. The memory controller 20 may refer to a lookup table LUT to determine the number of program cycles corresponding to the BER according to the plurality of reset write voltages and/or the BER and/or the BER according to the levels of the plurality of reset read voltages.

In some example embodiments, the control circuitry 13 may control the set data to be programmed in the memory cells MC of the memory block and store the number of set data bits programmed in the memory block region. The control circuitry 13 may compare the number of programmed set data bits with the number of set data bits read through the read circuit 122 and output a difference as a BER. The control circuitry 13 may provide the memory controller 20 with a BER for memory cells programmed to the plurality of set write currents and/or a BER for memory cells read with levels of the plurality of set read voltages. The memory controller 20 may refer to the lookup table LUT to determine the number of program cycles corresponding to the BER according to the plurality of set write voltages and/or the BER and/or the BER according to the levels of the plurality of set read voltages.

The voltage generator 14 may generate various kinds of voltages for performing the write and read operations on the memory cell array 11 based on the voltage control signal CTRL_vol. More specifically, the voltage generator 14 may generate a first driving voltage $V_{WL}$ for driving the plurality of word lines WL and a second driving voltage $V_{BL}$ for driving the plurality of bit lines BL.

The row decoder 15 may be connected to the memory cell array 11 through the plurality of word lines WL and may activate selected word lines among the plurality of word lines WL in response to the row address X_ADDR received from the control circuitry 13. The row decoder 15 may control voltage applied to the selected word lines among the plurality of word lines WL or control the connection relationship of the selected word lines in response to the row address X_ADDR.

The column decoder 16 may be connected to the memory cell array 11 through the plurality of bit lines BL and activate selected bit lines among the plurality of bit lines BL in response to the column address Y_ADDR received from the control circuitry 13. The column decoder 16 may control voltage applied to the selected bit lines among the plurality of bit lines BL or control the connection relationship of the selected bit lines in response to the column address Y_ADDR.

Figure 5:
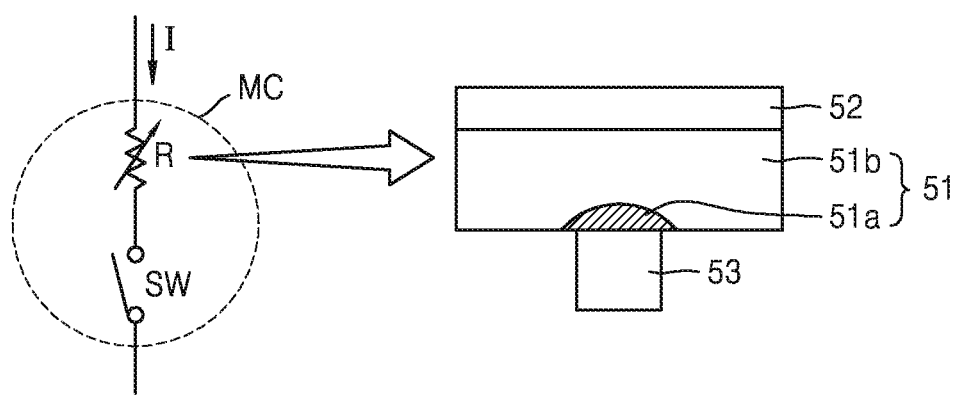
FIG. 5 illustrates an example of a variable resistive element included in a memory cell of FIG. 3.

FIG. 5 illustrates an example of the variable resistive element R included in the memory cell MC of FIG. 3.

Referring to FIG. 5, the memory cell MC may include a variable resistance element R and a switching element SW. The switching element SW may be implemented using various elements such as a transistor, a diode, and the like. As enlarged in FIG. 5, the variable resistive element R may include a phase change film 51 including a germanium, antimony and tellurium mixture (GST, Ge—Sb—Te), an upper electrode 52 formed on the phase change film 51 and a lower electrode 53 formed below the phase change film 51.

The upper and lower electrodes 52 and 53 may include various metals, a metal oxide, or a metal nitride. The upper and lower electrodes 52 and 53 may include aluminum (Al), copper (Cu), titanium nitride (TiN), titanium aluminum nitride (TixAlyNz), iridium (Jr), platinum (Pt), silver (Ag), gold (Au), polysilicon, tungsten (W), titanium (Ti), tantalum (Ta), tantalum nitride (TaN), tungsten nitride (WN), nickel (Ni), cobalt (Co), chrome (Cr), antimony (Sb), iron (Fe), molybdenum (Mo), palladium (Pd). Tin (Sn). Zirconium (Zr), zinc (Zn), iridium oxide ($IrO_2$), strontium oxide zirconate ($StZrO_3$), and the like.

The phase change film 51 may include a bipolar resistance memory material or a unipolar resistance memory material. The bipolar resistive memory material may be programmed to a set or reset state by the polarity of a current, and the bipolar resistive memory material may be Perovskite-based materials. Meanwhile, the unipolar resistance memory material may be programmed to the set or reset state by a current of the same polarity, and a transition metal oxide such as NiOx or TiOx may be used for the unipolar resistance memory material.

A GST material may be programmed between an amorphous state having a relatively high resistivity and a crystalline state having a relatively low resistivity. The GST material may be programmed by heating the GST material. The magnitude and time of heating may determine whether the GST material remains in the amorphous or crystalline state. The high resistivity and the low resistivity may each be represented by a programmed value logic "0" or logic "1", and may be detected by measuring the resistivity of the GST material. Conversely, the high resistivity and the low resistivity may each be represented by the programmed value logic "1" or logic "0".

In FIG. 5, when a write current I is applied to the memory cell MC, the applied write current I may flow through the lower electrode 53. When the write current I is applied to the memory cell MC for a very short time, the applied write current I may be only heated to Joule's heat by an adjacent film of the lower electrode 53. At this time, a limited part (e.g., the hatched part 51a in FIG. 5) of the phase change film 51 may enter the crystalline state (e.g., a set state) or the amorphous state (e.g., a reset state) due to a difference in a heating profile, while a remainder part 51b of the phase change film 51 may refrain from entering the crystalline state or the amorphous state. In some example embodiments, the remainder part 51b of the phase change film 51 may enter the crystalline state (e.g., a set state) or the amorphous state (e.g., a reset state) like the hatched part 51a of the phase change film 51.

Figure 6:
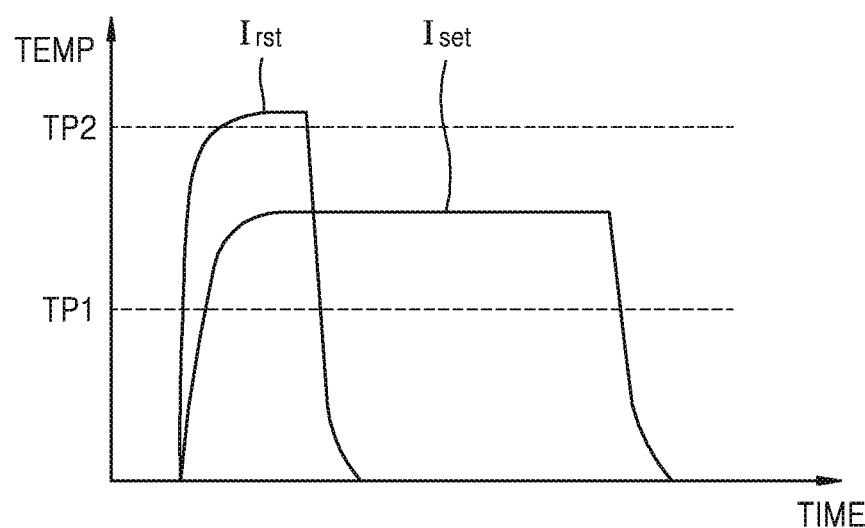
FIG. 6 is a graph for explaining a write current applied to the memory cell of FIG. 5.

FIG. 6 is a graph for explaining a write current applied to the memory cell MC of FIG. 5.

Referring to FIG. 6, to change the phase change film 51 to an amorphous state (e.g., a reset state), a high reset write current Irst may be applied to the memory cell MC for a short time and then removed. To change the phase change film 51 to a crystalline state (e.g., a set state), a low set write current Iset lower than the reset write current Irst may be applied to the memory cell MC and the applied set write current Iset may be maintained for a predetermined time and then removed such that the phase change film 51 is crystallized. The memory cell MC may be set to either the crystalline state or the amorphous state according to the above-described method. Here, TP1 denotes a crystallization temperature of the phase change film 51, and TP2 notes a melting point of the phase change film 51.

Figure 7A:
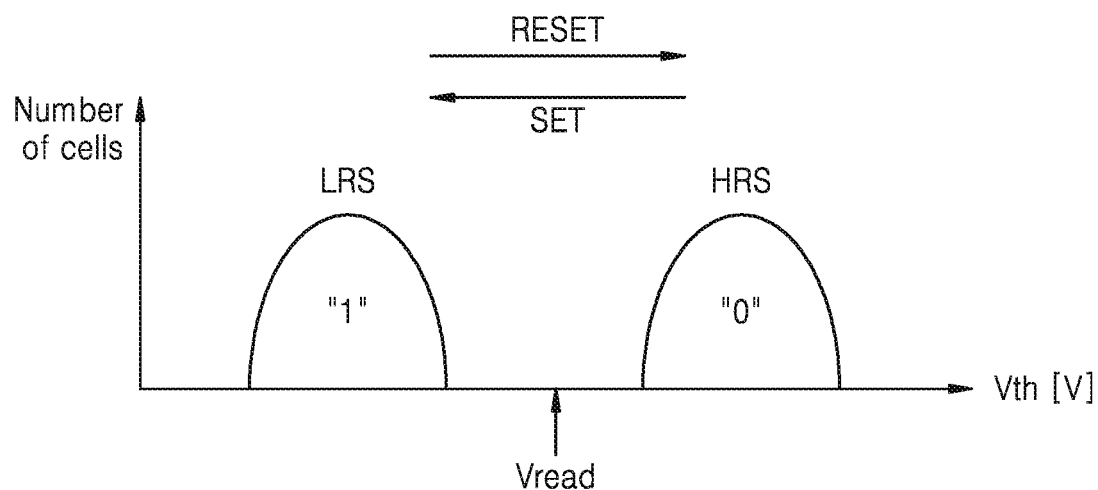
FIGS. 7A, 7B, and 7C are diagrams illustrating characteristics of memory cells when the memory cell of FIG. 5 is a single level cell.
Figure 7B:
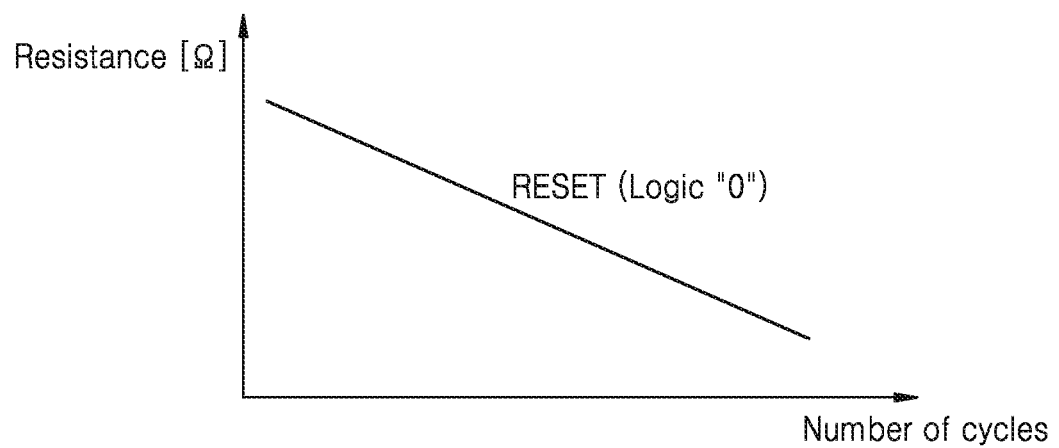
Figure 7C:
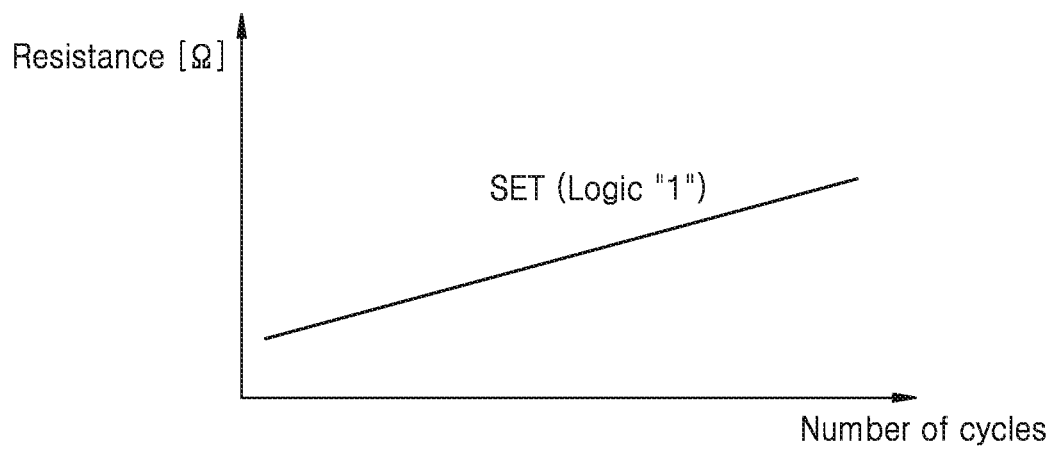

FIGS. 7A, 7B, and 7C are diagrams illustrating characteristics of the memory cells MC when the memory cell MC of FIG. 5 is a single level cell (SLC).

Referring to FIG. 7A, an ideal threshold voltage distribution of the SLCs in which the memory cell MC is programmed to 1 bit is shown. In FIG. 7A, the horizontal axis may represent a threshold voltage, and the vertical axis may represent the number of memory cells.

The variable resistive element R of the memory cell MC may have a low resistance state LRS or a high resistance state HRS. An operation of applying a write current to the memory cell MC and switching the variable resistive element R from the high resistance state HRS to the low resistance state LRS may be referred to as a set operation or a set write operation. An operation of applying the write current to the memory cell MC and switching the variable resistive element R from the low resistance state LRS to the high resistance state HRS may be referred to as a reset operation or a reset write operation.

A specific voltage between the scattering due to the low resistance state LRS and the scattering due to the high resistance state HRS may be set to the read voltage Vread. In a read operation on the memory cell MC, when a read result is equal to or higher than the read voltage Vread, reset data (logic "0") in the high resistance state HRS may be determined, and when the read result is equal to or lower than the read voltage Vread, set data (logic "1") in the low resistance state LRS may be determined. When the memory cell MC is repeatedly programmed to the reset data (logic "0") or set data (logic "1"), as shown in FIGS. 7B and 7C, the resistance characteristics of the memory cell MC may be degraded.

Referring to FIG. 7B, an exemplary characteristic of the memory cell MC that is continuously programmed to the reset data of logic "0" through application of a high current is shown. In FIG. 7B, the horizontal axis may represent the number of program cycles and the vertical axis may represent the resistance. The resistivity of the memory cell MC may well behave initially such that the phase change film 51 exhibits a high resistance. However, when the memory cell MC is continuously programmed to the reset data of logic "0" without any intervening programming to the set data of logic "1", the resistance of the memory cell MC may be reduced. As a result, sensing of the reset data of logic "0" may become more uncertain or slower, or be generally more unreliable since a sensing margin between the set data of logic "1" and the reset data of logic "0" is reduced. Thus, the reliability of a resistive memory device may be reduced.

Referring to FIG. 7C, the degradation of the reset data of logic "0" may also be present in the set data of logic "1". When the memory cell MC is continuously programmed to the set data of logic "1" without any intervening programming to the reset data of logic "0", the resistance of the memory cell MC may increase as a function of the number of program cycles. An increase in the resistance of the set data of logic "1" may reduce the sensing margin between the set data of logic "1" and the reset data of logic "0", thereby reducing the reliability of the resistive memory device.

Figure 8:
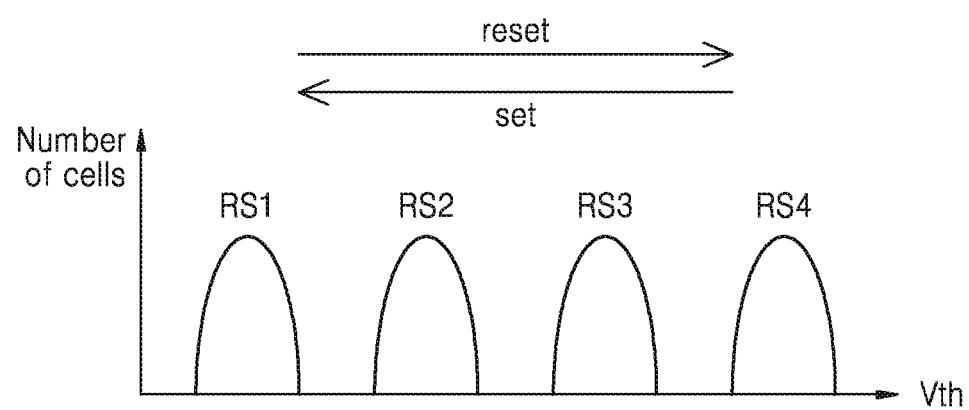
FIG. 8 is a graph showing a distribution of memory cells depending on a resistance when the memory cell of FIG. 5 is a multi level cell (MLC)

FIG. 8 is a graph showing the distribution of memory cells MC depending on the resistance when the memory cell MC of FIG. 5 is a multilevel cell MLC. In FIG. 8, the horizontal axis may represent a threshold voltage Vth and the vertical axis may represent the number of memory cells MC.

Referring to FIG. 8, when the memory cell MC is the MLC programmed to 2 bits, the memory cell MC may have one of a first resistance state RS1, a second resistance state RS2, a third resistance state RS3, and a fourth resistance state RS4. In some example embodiments, the memory device 10 may be controlled to program the memory cells MC of the memory cell array 11 to one or more resistance states of the first to fourth resistance states RS1 to RS4. The memory controller 20 may be configured to control the memory device 10 to program the memory cells MC of the memory cell array 11 to one or more resistance states of the first to fourth resistance states RS1 to RS4.

However, the inventive concepts are not limited thereto, and in other embodiments, a plurality of memory cells may include triple level cells TLCs that store three bits of data such that each memory cell may receive one of 8 resistance states. In some example embodiments, the plurality of memory cells may include memory cells that each may store 4 or more bits of data.

Since intervals between resistance distributions of the MLC are narrower than those of the SLC, a read error may occur due to a small change in a threshold voltage in the MLC. Therefore, the resistance states RS1, RS2, RS3, and RS4 may have threshold voltage ranges that are not overlapped with each other to secure a read margin.

Each of the resistance states RS1, RS2, RS3, and RS4 may correspond to any one of data '00', data '01', data '10', and data '11'. In some example embodiments, a resistance level may increase in order of the data '11', the data '01', the data '00', and the data '10'. That is, the first resistance state RS1 may correspond to the data '11', the second resistance state RS2 may correspond to the data '01', the third resistance state RS3 may correspond to the data '00', and the fourth resistance state RS4 may correspond to the data '10'.

Each of the resistance states RS1, RS2, RS3, and RS4 may spread the threshold voltage range as the number of program cycles of the memory cells MC increases. Accordingly, the read margin of each of the resistance states RS1, RS2, RS3, and RS4 may be reduced.

Figure 9:
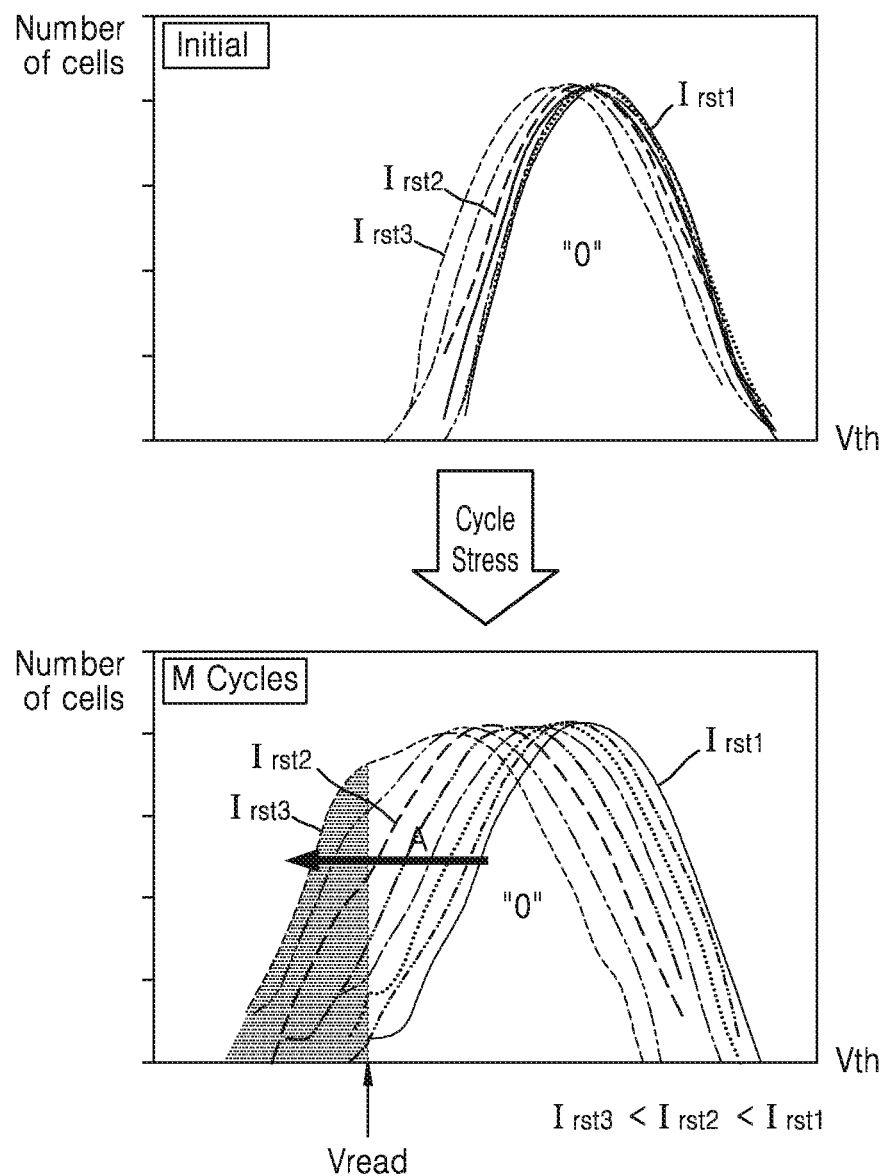
FIG. 9 is a diagram for explaining threshold voltage distributions of the memory cells of FIG. 7A in a reset data state

FIG. 9 is a diagram for explaining threshold voltage distributions of the memory cells MC of FIG. 7A in a reset data state.

Referring to FIG. 9, the threshold voltage distributions of reset data according to program operations performed by applying a plurality of reset write currents Irst1, Irst2, and Irst3 to the memory cell MC are shown. In an initial program operation, threshold voltage distributions of the reset data of the memory cells MC programmed according to the plurality of reset write currents Irst1, Irst2, and Irst3 may have almost the same shape. Thereafter, when the number of program cycles increases about M times, it may be seen that the shape of the threshold voltage distributions of the reset data is changed and widened (A).

For example, it is assumed that, among the plurality of reset write currents Irst1, Irst2, and Irst3, the highest current is the first reset write current Irst1 and the lowest current is the third reset write current Irst3. It may be seen that the threshold voltage distribution of the reset data of the memory cell MC programmed to the lowest third reset write current Irst3 is shifted to the left, i.e., toward a low resistance state of the set data, and is greatly widened due to the stress according to the M number of program cycles.

When the memory cells MC programmed to the third reset write current Irst3 are read using the read voltage Vread when reading the memory cells MC, the memory cells MC belonging to a hatched part may be programmed to the reset data but may be determined as the set data due to the reduction of the threshold voltage. That is, the number of memory cells belonging to the hatched part may be represented as a BER that may be large. It may be expected that the BER of the reset data according to the third reset write current Irst3 will further become larger as the number of program cycles increase. Accordingly, the BER of the reset data according to the lowest third reset write current Irst3 may be a reference for detecting degradation of the memory cells MC according to the number of program cycles. Here, when the BER of the reset data is monitored by using the minimum reset current necessary for the phase change film 51 of the memory cell MC to cause a phase change to a reset state, the BER may be an optimal reference for detecting a degradation degree of the memory cells MC and/or a degradation level of the memory device 10.

FIGS. 10, 11, 12, and 13 are diagrams illustrating methods of detecting degradation of the memory device 10 according to some example embodiments of the inventive concepts.

In FIGS. 10 through 13, the methods of detecting degradation of the memory device 10 using reset data of the memory cells MC by the memory controller 20 (FIG. 1) are described. Under the control of the memory controller 20, the memory device 10 may apply the first through third reset write currents Irst1, Irst2 and Irst3 to the memory cells MC to perform a write operation such that the memory cells MC are programmed to reset data. Thereafter, to determine a program state of the memory cells MC, under the control of the memory controller 20, the memory device 10 may use the first through third reset read voltages VR1, VR2 and VR3 to perform a read operation. Among the first through third reset write currents Irst1, Irst2 and Irst3, the first reset write current Irst1 may be the highest and the third reset write current Irst3 may be the lowest and may be set to the minimum reset write current necessary for the phase change film 51 of the memory cell MC to cause a phase change to a reset state. Accordingly, the third reset write current Irst3 may be a minimum reset write current necessary for a memory cell MC to change to a high resistance state. A read direction in the first through third reset read voltages VR1, VR2, and VR3 may be set to a direction in which a voltage level is reduced from the first reset read voltage VR1 to the third reset read voltage VR3.

Figure 10:
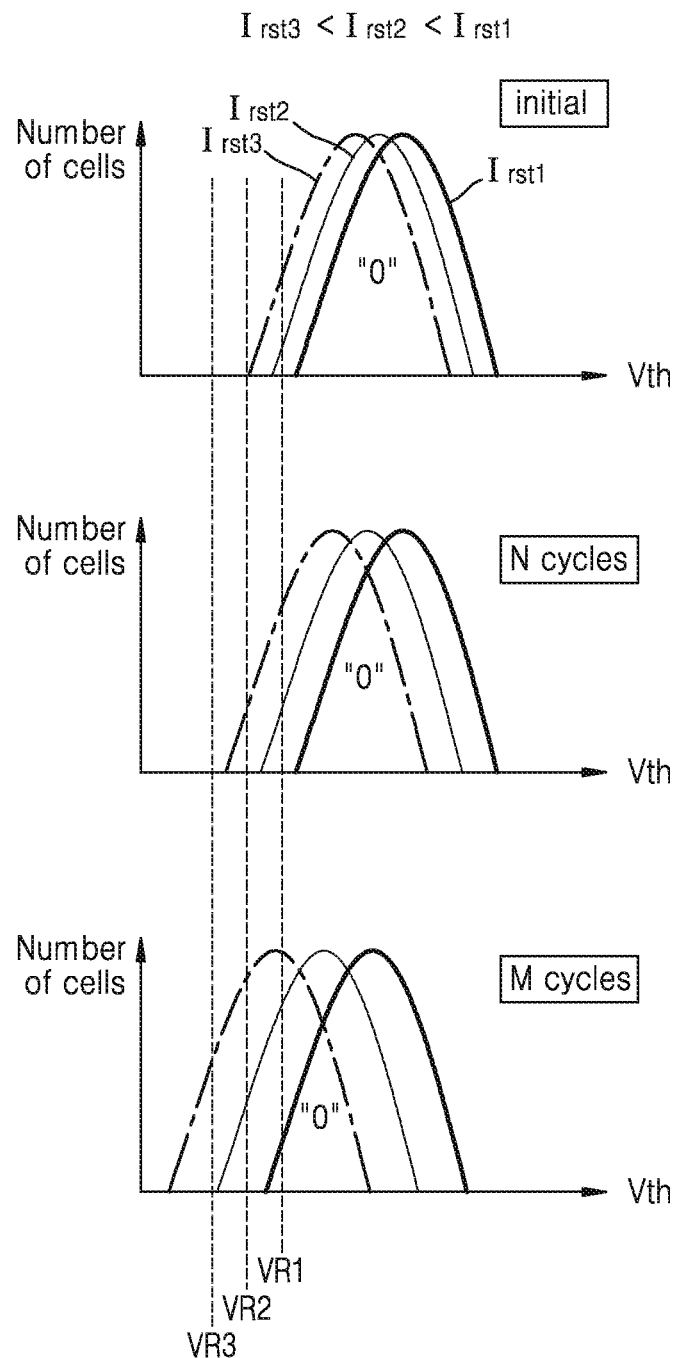

Referring to FIG. 10, reset data threshold voltage distributions are shown when program operations of applying each of the first through third reset write currents Irst1, Irst2, and Irst3 to the memory cells MC are performed, and, in an initial program operation, after N number of program cycles and then M (M>N) number of program cycles, data of the memory cells MC is read. It may be seen that a threshold voltage distribution shape in the initial program operation is shifted to the left and widened as the number of program cycles increase.

The threshold voltage distributions of the reset data shown in some example embodiments may correspond to a distribution according to the high resistance state HRS of FIG. 7A or any one of the distributions of the second through fourth resistance states RS2, RS3, RS4 of FIG. 8. In the MLC of FIG. 8, the threshold voltage distributions of the reset data shown in some example embodiments may correspond to a threshold voltage distribution of the fourth resistance state RS4, which is the highest resistance state.

Figure 11:
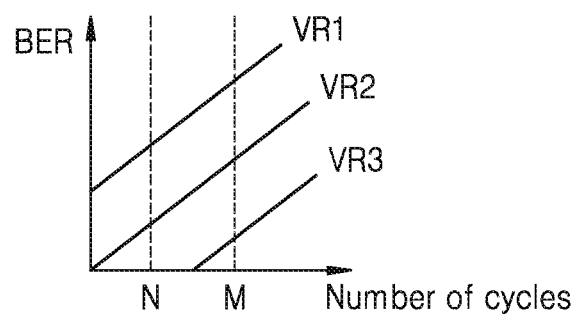

According to some example embodiments, the memory controller 20 (FIG. 1) may read the memory cells MC after programming the memory cells MC to a specific write current, to detect a degradation degree of the memory cells MC. For example, when the memory cells MC programmed to the third reset write current Irst3 are read, as shown in FIG. 11, a BER may vary according to voltage levels of the first through third reset read voltages VR1, VR2, and VR3. As the number of program cycles increase, the BER according to the first through third reset read voltages VR1, VR2, and VR3 may increase. In some example embodiments, the number of reset read voltages VR1, VR2, and VR3 is three, but the inventive concepts is not limited thereto, and the number of reset read voltage levels may be variously changed.

The BER according to the first through third reset read voltages VR1, VR2 and VR3 may be provided to the memory controller 20 (FIG. 1). The memory controller 20 may determine the BER according to the voltage levels of the first through third reset read voltages VR1, VR2 and VR3 and detect the degradation degree of the memory cells MC. The memory controller 20 may refer to the lookup table LUT when determining the BER. The lookup table LUT may show the correlation between the number of program cycles and the BER according to a plurality of reset read voltage levels and may be stored in the memory controller 20. The memory controller 20 may determine the number of program cycles corresponding to the BER according to the voltage levels of the first through third reset read voltages VR1, VR2 and VR3 with reference to the lookup table LUT.

Figure 12:
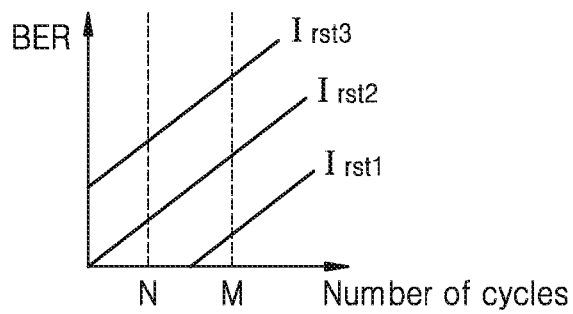

According to some example embodiments, the memory controller 20 may program the memory cells MC to a plurality of reset write currents and then read the memory cells MC to a specific reset read level to detect the degradation degree of the memory cells MC. For example, when the memory cells MC programmed to the first through third reset write currents Irst1, Irst2, and Irst3 are read with the first reset read voltage VR1, as shown in FIG. 12, the BER may vary according to current levels of the first through third reset write currents Irst1, Irst2 and Irst3. As the number of program cycles increase, the BER according to the first through third reset write currents Irst1, Irst2, and Irst3 may increase. In some example embodiments, the number of reset write currents Irst1, Irst2, and Irst3 is three, but the inventive concepts is not limited thereto, and the number of reset write current levels may be variously changed.

The BER according to the first through third reset write currents Irst1, Irst2 and Irst3 may be provided to the memory controller 20. The memory controller 20 may determine the BER according to the current levels of the first through third reset write currents Irst1, Irst2 and Irst3 and detect the degradation degree of the memory cells MC. The memory controller 20 may refer to the lookup table LUT when determining the BER. The lookup table LUT may show the relationship between the number of program cycles and the BER according to the plurality of the reset write current levels and may be stored in the memory controller 20. The memory controller 20 may determine the number of program cycles corresponding to the BER according to the first through third reset write currents Irst1, Irst2, and Irst3 with reference to the lookup table LUT.

The lookup table LUT may be set as a ratio of the number of program cycles and error bits as shown in FIG. 13. In FIG. 13, the horizontal axis of the lookup table LUT may represent a BER according to the plurality of reset read voltages VR and the vertical axis thereof may represent a BER according to the plurality of the reset write current Irst. An intersection of the horizontal axis and the vertical axis may be the number of program cycles NPC. The lookup table LUT may be determined at the time of manufacturing the memory controller 20 and may be updated in real time.

The memory controller 20 may determine the number of program cycles corresponding to the BER according to a specific reset read voltage level and/or the BER according to a specific reset write current level provided from the memory device 10 with reference to the lookup table LUT. The memory controller 20 may determine the number of program cycles corresponding to the BER and detect the degradation degree of the memory device 10.

Figure 14:
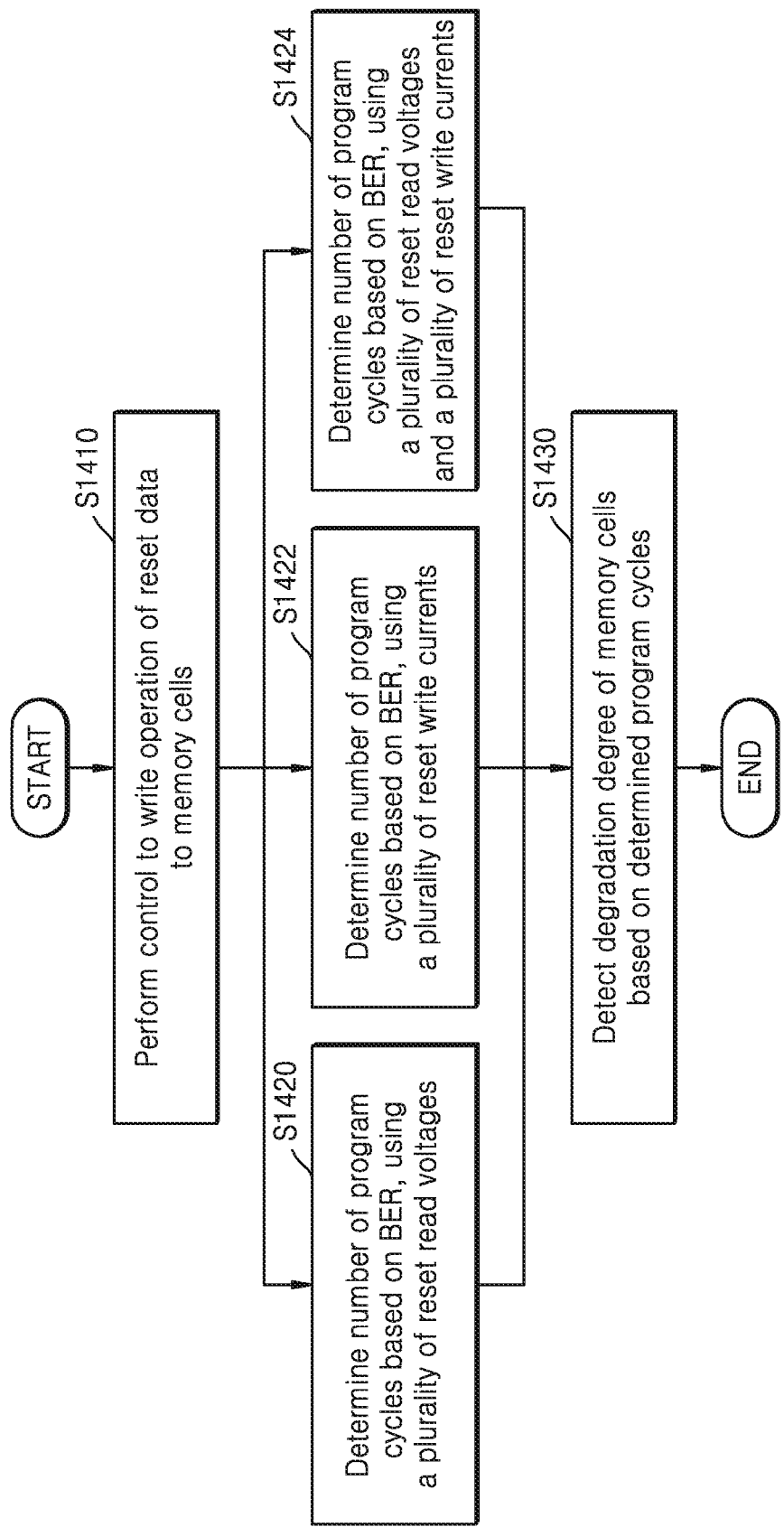
FIG. 14 is a flowchart showing a method performed by a memory controller of detecting degradation of a memory device according to some example embodiments of the inventive concepts.

FIG. 14 is a flowchart showing a method performed by a memory controller of detecting degradation of a memory device according to some example embodiments of the inventive concepts.

Referring to FIG. 14 in conjunction with FIGS. 1 and 2, in operation S1410, the memory controller 20 may control the memory cells MC of the memory device 10 to be programmed to reset data. In accordance with the write operation control of the memory controller 20, the memory device 10 may perform a reset data write operation. The control circuitry 13 of the memory device 10 may program the reset data to the memory cells MC in all or some of memory blocks in the memory cell array 11. At this time, the control circuitry 13 may store the number of programmed reset data bits in a memory block region. The controlling at S1410 may include controlling the memory device 10 to program the memory cells MC in all or some of the memory blocks in the memory cell array 11 to a resistance state. The resistance state may be a one resistance state of a plurality of resistance states. In some example embodiments, the resistance state may be a first resistance state RS1. In some example embodiments, the resistance state may be a fourth resistance state RS4. In some example embodiments, the resistance state is a high resistance state of a plurality of resistance states (e.g., resistance states RS1 to RS4). The programming may include repeatedly programming the memory cells MC to the resistance state.

In operation S1420, the memory controller 20 may determine the number ("quantity") of program cycles of the memory device 10 based on a BER according to a plurality of reset read voltages provided in the memory device 10. The memory device 10, as described with reference to FIG. 11, may program the memory cells MC to the reset data by applying a specific write current (e.g., Irst3) to the memory cells MC (e.g., program the memory cells MC to a first resistance state RS1) and then control the memory device 10 to read the programmed memory cells MC in accordance with voltage levels of the plurality of reset read voltages (e.g. VR1, VR2, and VR3). The control circuitry 13 of the memory device 10 may compare the number of programmed reset data bits with the number of read reset data bits and provide a difference to the memory controller 20 as a BER. The control circuitry 13 may output, to an outside of the memory device 10, the BER to enable a number of program cycles of the memory cells MC to be determined based on the BER. Accordingly, a BER of the memory cells MC generated during a read operation may be received from the memory device 10. The BER may be received according to the plurality of reset read voltages. The memory controller 20 may refer to the lookup table LUT to determine the number of program cycles corresponding to the BER according to the plurality of reset read voltages, where the lookup table LUT may indicate a correlation between the BER and the number of program cycles.

In operation S1422, the memory controller 20 may determine the number of program cycles of the memory device 10 based on a BER according to a plurality of write currents provided in the memory device 10. The memory device 10, as described with reference to FIG. 12, may program the memory cells MC to the reset data (e.g., programming the memory cells to a high resistance state) by applying current levels of the plurality of reset write currents Irst1, Irst2, and Irst3 to the memory cells MC, where the plurality of reset write currents include a minimum reset write current necessary for the memory cells MC to change to the high resistance state (e.g., Irst3), and then read the memory cells MC in accordance with a voltage level of a specific reset read voltage (e.g. VR1). The control circuitry 13 of the memory device 10 may compare the number of programmed reset data bits with the number of read reset data bits and provide a difference to the memory controller 20 as a BER. The memory controller 20 may determine the number of program cycles corresponding to the BER according to the plurality of reset write currents with reference to the lookup table LUT.

In operation S1424, the memory controller 20 may determine the number of program cycles of the memory device 10 based on the BER according to the plurality of reset read voltages provided in the memory device 10 and the BER according to the plurality of reset write currents. The memory device 10 may read the memory cells MC according to the levels of the plurality of reset read voltages after applying the levels of the plurality of reset write currents to the memory cells MC and programming the memory cells MC to the reset data. The memory controller 20 may refer to the lookup table LUT to determine the number of program cycles corresponding to a BER according to a specific reset write current level among the plurality of reset write current levels and a BER according to a specific reset read voltage level among the plurality of reset read voltage levels.

In operation S1430, the memory controller 20 may detect a degradation degree of the memory cells MC based on the number of program cycles determined in operation S1420, S1422, or S1424. The memory controller 20 may replace a memory block of the memory cell array 11 with another memory block when it is determined that the number of program cycles corresponding to the BER is high (wherein a high degradation degree of the memory cells MC may be determined based on the determination that the number of program cycles corresponding to the BER is high), thereby previously preventing an error caused by degradation of the memory device 10. Accordingly, the operating of a memory controller to determine a number of program cycles of the memory cells MC of a memory device 10, based on the BET as described herein, may enable improved functioning of a computing device, electronic device, or the like that includes the memory controller 20 and the memory device 10, based on avoiding performance degradation of the memory device 10, where said avoiding may include determining an increase in degradation of at least a memory block of a memory cell array 11 and responsively replacing a memory block of the memory cell array 11 with another memory block. Accordingly, the performance of the computing device, electronic device, or the like may be improved based on switching to memory blocks with reduced degradation and thus having a retention time at which data may be preserved and an endurance level at which a normal operation may be performed without being worn out when writing data, such that the sensing of the reset data may become less uncertain or slower and the possibility of multiple bit errors in the operation of the device may be reduced.

Figure 15:
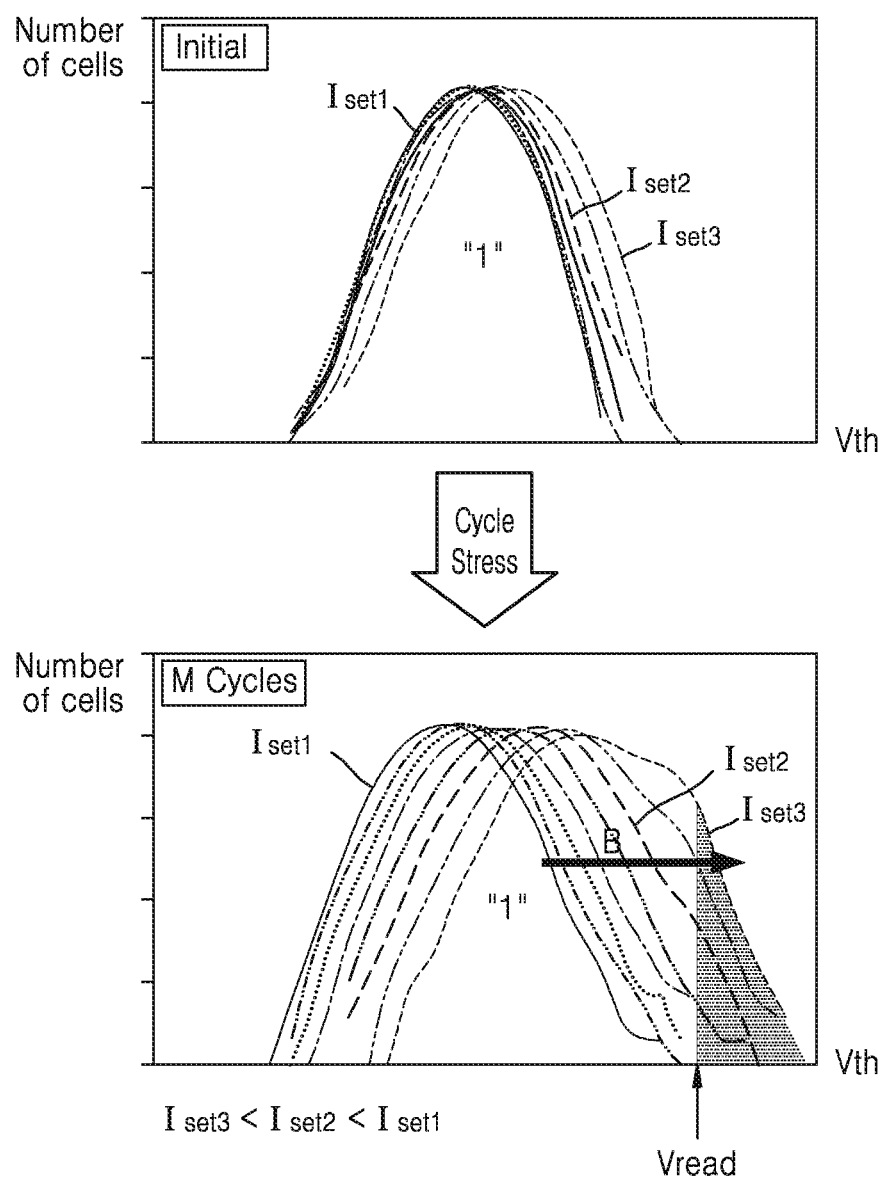
FIG. 15 is a graph for explaining threshold voltage distributions of the memory cells of FIG. 7A in a set data state.

FIG. 15 is a graph for explaining threshold voltage distributions of the memory cells MC of FIG. 7A in a set data state.

Referring to FIG. 15, the threshold voltage distributions of set data according to program operations after applying the plurality of set write currents Iset1, Iset2, and Iset3 to the memory cell MC to perform the program operations are shown. In an initial program operation, the threshold voltage distributions of the set data of the programmed memory cells MC according to the plurality of set write currents Iset1, Iset2, and Iset3 may have almost the same shape. Thereafter, when the number of program cycles increases to M times, it may be seen that the shape of the threshold voltage distributions of the set data is changed and widened (B).

For example, it is assumed that the highest current among the plurality of set write currents Iset1, Iset2, and Iset3 is the first set write current Iset1 and the lowest current is the third set write current Iset3. It may be seen that the threshold voltage distribution of the set data of the memory cell MC programmed to the lowest third reset write current Irst3 is shifted to the right, i.e., toward a high resistance state of the reset data, and is greatly widened due to the stress according to the M number of program cycles.

When the memory cells MC programmed to the third reset write current Irst3 are read using the read voltage Vread when reading the memory cells MC, the memory cells MC belonging to a hatched part may be programmed to the set data but may be determined as the reset data due to the reduction of the threshold voltage. That is, it may be expected that a BER of the memory cells MC cells belonging to the hatched part may be large, and the BER of the set data according to the third reset write current Irst3 will further become larger as the number of program cycles increases. Accordingly, the BER of the set data according to the lowest third reset write current Irst3 may be a reference for detecting degradation of the memory cells MC according to the number of program cycles. Here, when the BER of the set data is monitored by using the minimum set write current necessary for the phase change film 51 of the memory cell MC to cause a phase change to a set state, the BER may be an optimal reference for detecting a degradation degree of the memory cells MC and/or a degradation level of the memory device 10.

FIGS. 16, 17, 18, and 19 are diagrams illustrating methods of detecting degradation of the memory device 10 according to some example embodiments of the inventive concepts. In FIGS. 16 to 19, the methods of detecting the degradation of the memory device 10 using set data of the memory cells MC are described. Under the control of the memory controller 20, the memory device 10 may apply the first through third set write currents Iset1, Iset2 and Iset3 to the memory cells MC to perform a write operation such that the memory cells MC are programmed to set data. Thereafter, to determine a program state of the memory cells MC, the memory device 10 may use the first through third set read voltages VS1, VS2, and VS3 to perform a read operation. Among the first through third set write currents Iset1, Iset2 and Iset3, the first set write current Iset1 may be the highest and the third set write current Iset3 may be the lowest and may be set to the minimum current necessary for the phase change film 51 of the memory cell MC to cause a phase change to a set state. Accordingly, the third set write current Iset3 may be a minimum set write current necessary for a memory cell MC to change to a low resistance state. A read direction in the first through third set read voltages VS1, VS2 and VS3 may be set to a direction in which a voltage level increases from the first set read voltage VS1 to the third set read voltage VS3.

Figure 16:
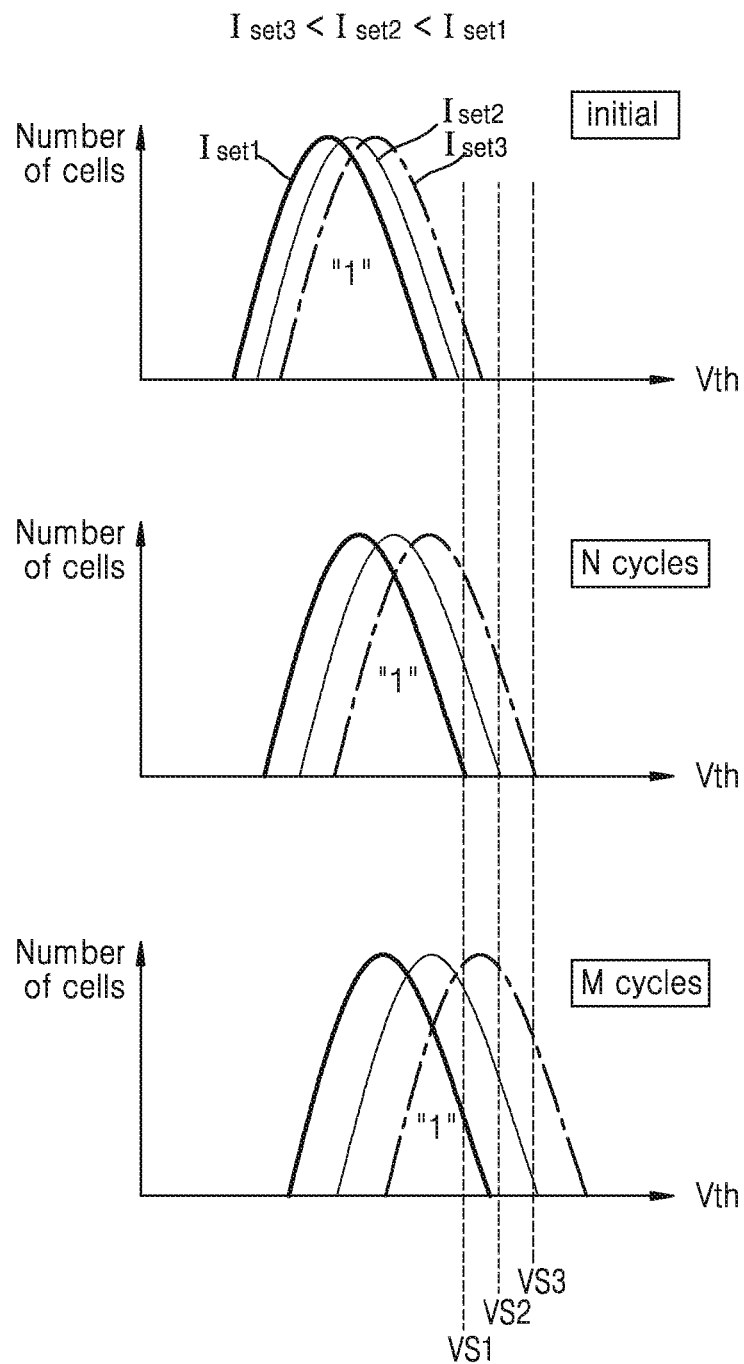

Referring to FIG. 16, set data threshold voltage distributions are shown when program operations of applying each of the first through third set write currents Iset1, Iset2 and Iset3 to the memory cells MC are performed, and, in an initial program operation, after N number of program cycles and then M (M>N) number of program cycles, data of the memory cells MC is read. It may be seen that a threshold voltage distribution shape in the initial program operation is shifted to the right and widened as the number of program cycles increase.

The threshold voltage distributions of the set data shown in some example embodiments may correspond to a distribution according to the low resistance state LRS of FIG. 7A or any one of the distributions of the first through third resistance states RS1, RS2, and RS3 of FIG. 8. In the MLC of FIG. 8, the threshold voltage distributions of the set data shown in some example embodiments may correspond to a threshold voltage distribution of the first resistance state RS1, which is the lowest resistance state.

Figure 17:
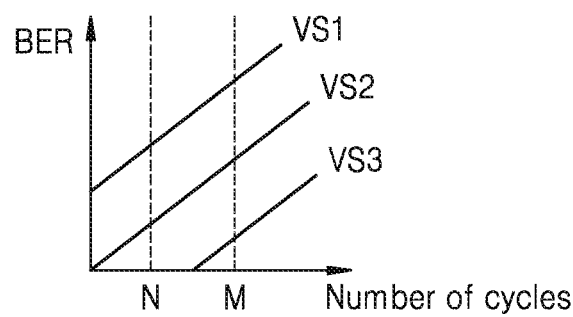

According to some example embodiments, the memory controller 20 may read the memory cells MC after programming the memory cells MC to a specific set write current, to detect a degradation degree of the memory cells MC. For example, when the memory cells MC programmed to the third set write current Iset3 are read, as shown in FIG. 17, a BER may vary according to voltage levels of the first through third set read voltages VS1, VS2 and VS3. As the number of program cycles increase, the BER according to the first through third set read voltages VS1, VS2 and VS3 may increase. In some example embodiments, the number of set read voltages VS1, VS2 and VS3 is three, but the inventive concepts are not limited thereto, and the number of set read voltage levels may be variously changed.

The BER according to the first through third set read voltages VS1, VS2 and VS3 may be provided to the memory controller 20. The memory controller 20 may determine the BER according to the voltage levels of the first through third set read voltages VS1, VS2 and VS3 and detect the degradation degree of the memory cells MC. The memory controller 20 may refer to the lookup table LUT when determining the BER. The lookup table LUT may show the correlation between the number of program cycles and the BER according to a plurality of set read voltage levels and may be stored in the memory controller 20. The memory controller 20 may determine the number of program cycles corresponding to the BER according to the voltage levels of the first through third set read voltages VS1, VS2 and VS3.

Figure 18:
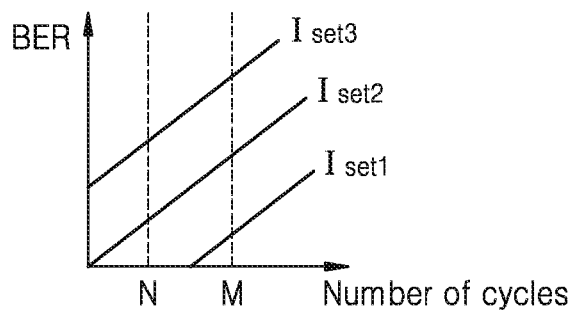

According to some example embodiments, the memory controller 20 may program the memory cells MC to a plurality of set write currents and then read the memory cells MC to a specific set read level to detect the degradation degree of the memory cells MC. For example, when the memory cells MC programmed to the first through third set write currents Iset1, Iset2 and Iset3 are read with the first set read voltage VS1, as shown in FIG. 18, the BER may vary according to current levels of the first through third set write currents Iset1, Iset2 and Iset3. As the number of program cycles increase, the BER according to the first through third set write currents Iset1, Iset2 and Iset3 may increase. In some example embodiments, the number of set write currents Iset1, Iset2 and Iset3 is three, but the inventive concepts is not limited thereto, and the number of set write current levels may be variously changed.

The BER according to the first through third set write currents Iset1, Iset2 and Iset3 may be provided to the memory controller 20. The memory controller 20 may determine the BER according to the current levels of the first through third set write currents Iset1, Iset2 and Iset3 and detect the degradation degree of the memory cells MC. The memory controller 20 may refer to the lookup table LUT when determining the BER. The lookup table LUT may show the relationship between the number of program cycles and the BER according to the plurality of the set write current levels and may be stored in the memory controller 20. The memory controller 20 may determine the number of program cycles corresponding to the BER according to the first through third set write currents Iset1, Iset2 and Iset3.

In the lookup table LUT as shown in FIG. 19, the horizontal axis may represent a BER according to the plurality of set read voltages VS and the vertical axis may represent a BER according to the plurality of the set write current Iset. An intersection of the horizontal axis and the vertical axis may be the number of program cycles NPC. The lookup table LUT may be determined at the time of manufacturing the memory controller 20 and may be updated in real time.

The memory controller 20 may determine the number of program cycles corresponding to the BER according to a specific set read voltage level and/or the BER according to a specific set write current level provided from the memory device 10 with reference to the lookup table LUT. The memory controller 20 may determine the number of program cycles corresponding to the BER and detect the degradation degree of the memory device 10.

Figure 20:
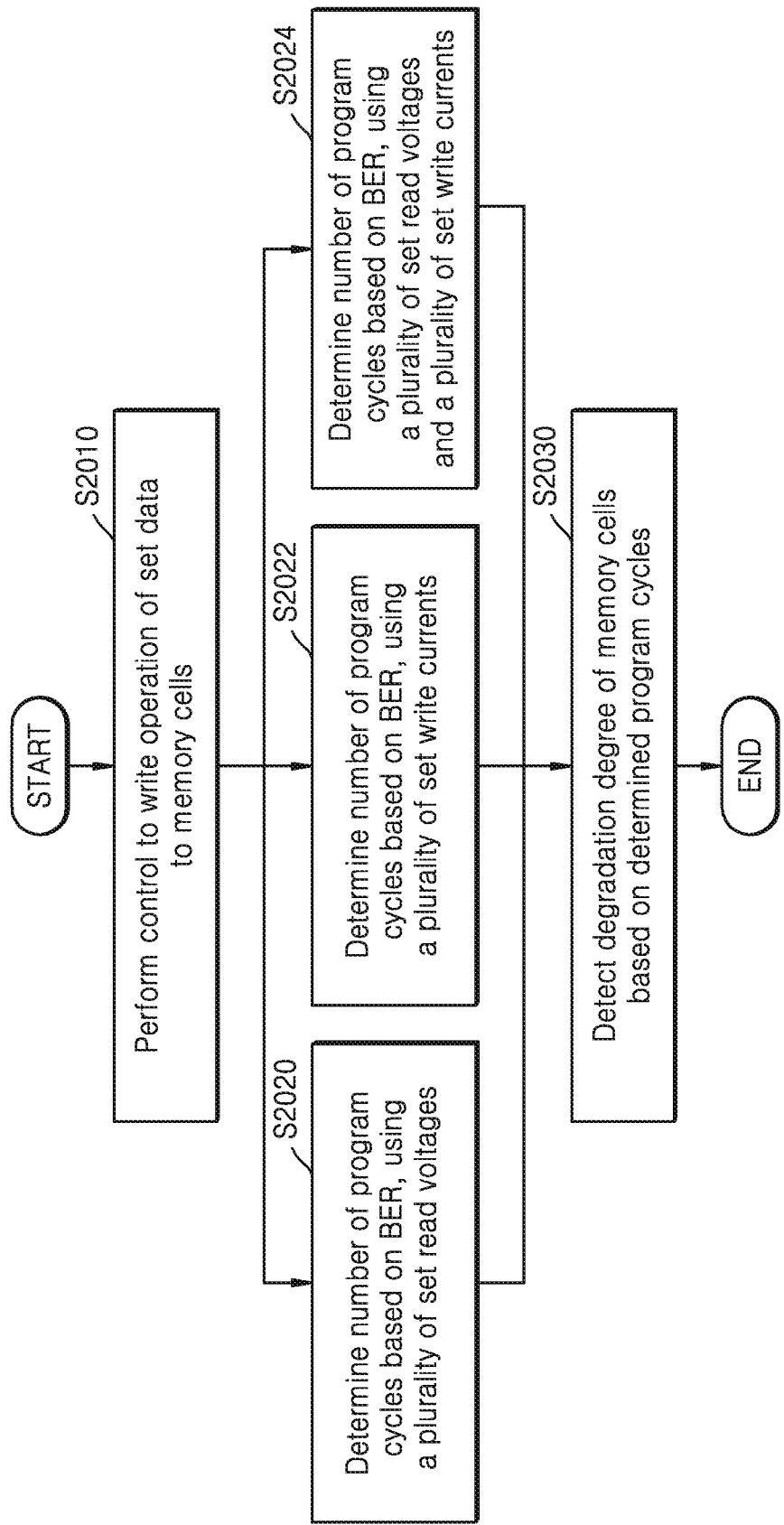
FIG. 20 is a flowchart illustrating a method of detecting degradation of a memory device according to some example embodiments of the inventive concepts.

FIG. 20 is a flowchart illustrating a method of detecting degradation of the memory device 10 according to some example embodiments of the inventive concepts.

Referring to FIG. 20 in conjunction with FIGS. 1 and 2, in operation S2010, a write operation may be performed to program the memory cells MC to set data. Under the control of the memory controller 20, the memory device 10 may perform a set data write operation. The control circuitry 13 of the memory device 10 may program the set data to the memory cells MC in all or some of memory blocks in the memory cell array 11. At this time, the control circuitry 13 may store the number of programmed set data bits in a memory block. The controlling at S2010 may include controlling the memory device 10 to program the memory cells MC in all or some of the memory blocks in the memory cell array 11 to a resistance state. The resistance state may be a one resistance state of a plurality of resistance states. In some example embodiments, the resistance state may be a first resistance state RS1. In some example embodiments, the resistance state may be a fourth resistance state RS4. In some example embodiments, the resistance state is a low resistance state of a plurality of resistance states (e.g., resistance states RS1 to RS4). The programming may include repeatedly programming the memory cells MC to the resistance state.

In operation S2020, the memory controller 20 may determine the number of program cycles the memory device 10 based on a BER according to a plurality of set read voltages provided in the memory device 10. The memory device 10 may program the memory cells Mc to the set data by applying a specific set write current (e.g., Iset3) to the memory cells MC and then control the memory device 10 to read the programmed memory cells MC in accordance with levels of the plurality of set read voltages (e.g. VS1, VS2, and VS3). The control circuitry 13 of the memory device 10 may compare the number of programmed set data bits with the number of read set data bits and provide a difference to the memory controller 20 as a BER. Accordingly, a BER of the memory cells MC generated during a read operation may be received from the memory device 10. The BER may be received according to the plurality of set read voltages. The memory controller 20 may refer to the lookup table LUT to determine the number of program cycles corresponding to the BER according to the plurality of set read voltages, where the lookup table LUT may indicate a correlation between the BER and the number of program cycles.

In operation S2022, the memory controller 20 may determine the number of program cycles of the memory device 10 based on a BER according to a plurality of set write currents provided in the memory device 10. The memory device 10 may program the memory cells MC to the set data (e.g., programming the memory cells to a low resistance state) by applying levels of the plurality of set write currents (e.g. Iset1, Iset2, and Iset3) to the memory cells MC, where the plurality of set write currents include a minimum set write current necessary for the memory cells MC to change to the low resistance state (e.g., Iset3) and then read the memory cells MC in accordance with a level of a specific set read voltage (e.g. VS1). The control circuitry 13 of the memory device 10 may compare the number of programmed set data bits with the number of read set data bits and provide a difference to the memory controller 20 as a BER. The memory controller 20 may determine the number of program cycles corresponding to the BER according to the plurality of set write currents with reference to the lookup table LUT.

In operation S2024, the memory controller 20 may determine the number of program cycles of the memory device 10 based on the BER according to the plurality of set read voltages provided in the memory device 10 and the BER according to the plurality of set write currents. The memory device 10 may read the memory cells MC according to the levels of the plurality of set read voltages after applying the levels of the plurality of set write currents to the memory cells MC and programming the memory cells MC to the set data. The memory controller 20 may refer to the lookup table LUT to determine the number of program cycles corresponding to a BER according to a specific set write current level among the plurality of set write current levels and a BER according to a specific set read voltage level among the plurality of set read voltage levels.

In operation S2030, the memory controller 20 may detect a degradation degree of the memory cells MC based on the number of program cycles determined in operation S2020, S2022, or S2024. The memory controller 20 may replace a memory block of the memory cell array 11 with another memory block when it is determined that the number of program cycles corresponding to the BER is high, thereby previously preventing an error caused by degradation of the memory device 10. Accordingly, the operating of a memory controller to determine a number of program cycles of the memory cells MC of a memory device 10, based on the BET as described herein, may enable improved functioning of a computing device, electronic device, or the like that includes the memory controller 20 and the memory device 10, based on avoiding performance degradation of the memory device 10, where said avoiding may include determining an increase in degradation of at least a memory block of a memory cell array 11 and responsively replacing a memory block of the memory cell array 11 with another memory block. Accordingly, the performance of the computing device, electronic device, or the like may be improved based on switching to memory blocks with reduced degradation and thus having a retention time at which data may be preserved and an endurance level at which a normal operation may be performed without being worn out when writing data, such that the sensing of the set data may become less uncertain or slower and the possibility of multiple bit errors in the operation of the device may be reduced.

Figure 21:
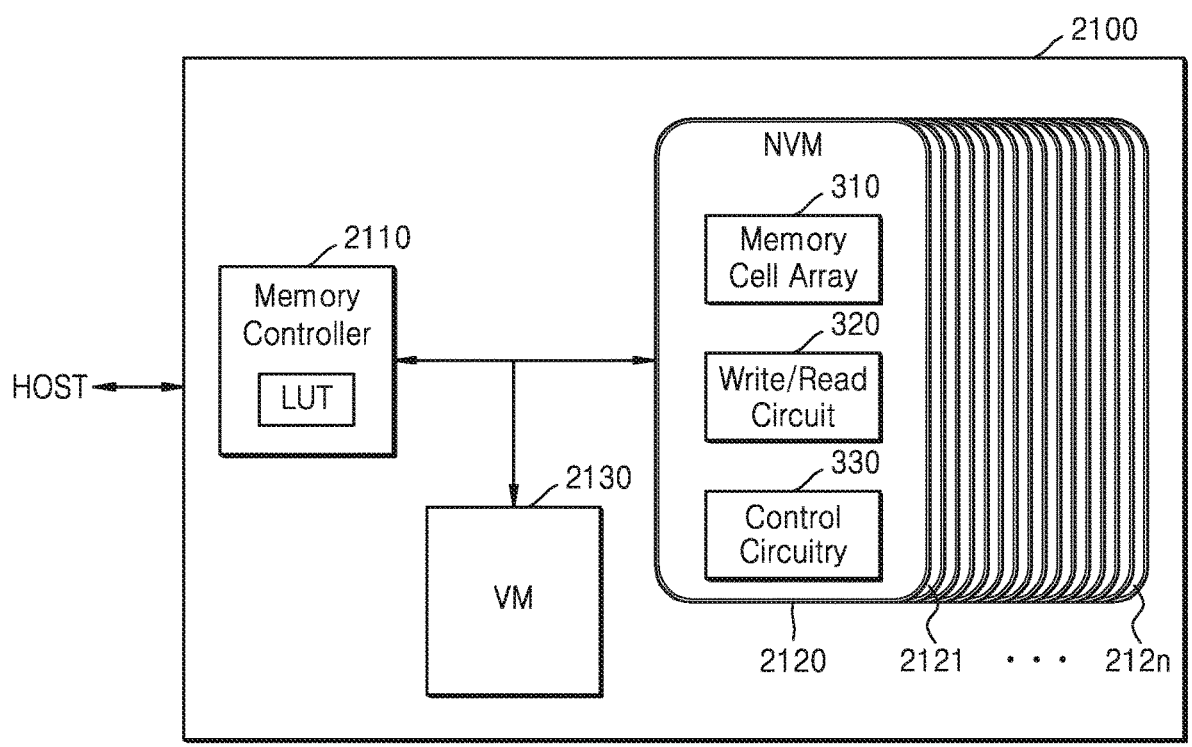
FIG. 21 is a block diagram illustrating a schematic configuration of a memory system employing a method performed by a memory controller of detecting degradation of a memory device according to some example embodiments of the inventive concepts.

FIG. 21 is a block diagram illustrating a schematic configuration of a memory system 2100 employing a method performed by a memory controller 2110 of detecting degradation of a memory device according to some example embodiments of the inventive concepts. Such a memory system 2100 may be referred to herein as a computing device, an electronic device, or the like.

Referring to FIG. 21, the memory system 2100 may include the memory controller 2110, a plurality of non-volatile memory devices 2120 through 212n, and a volatile memory device 2130. The memory controller 2110 may control write and/or read operations of the plurality of non-volatile memory devices 2120 through 212n in response to a request from a host HOST connected to the memory system 2100.

According to some example embodiments, the host HOST may be an arbitrary computing system such as a personal computer (PC), a server computer, a workstation, a laptop, a mobile phone, a smart phone, a personal digital assistant (PDA), a portable multimedia player (PMP), a digital camera, a digital television, a set-top box, a music player, a portable game console, a navigation system, and the like.

The plurality of non-volatile memory devices 2120 through 212n (n being an integer greater than or equal to 0) may be used as storage media of the memory system 2100. Each of the non-volatile memory devices 2120 through 212n may be, for example, a resistive memory device. The plurality of non-volatile memory devices 2120 through 212n (including non-volatile memory device 2121 where n is greater than zero) may be connected to the memory controller 2110 via a channel. Each of the non-volatile memory devices 2120 through 212n may perform a write operation and/or a read operation in response to a request from the host HOST provided via the channel.

The volatile memory device 2130 may temporarily store write data provided from the host HOST or read data from the non-volatile memory devices 2120 through 212n. The volatile memory device 2130 may store metadata or cache data to be stored in the non-volatile memory devices 2120 through 212n. The volatile memory device 2130 may include a DRAM, an SRAM, or the like.

Each of the non-volatile memory devices 2120 through 212n may be a resistive memory device corresponding to the memory device 10 described in FIGS. 1 through 20. Each of the non-volatile memory devices 2120 through 212n may include a memory cell array 310 including memory cells, a write/read circuit 320 that programs the memory cells to a first resistance state and reads the programmed memory cells, and a control circuitry 330 that outputs a BER of the memory cells generated during the read operation to the memory controller 2110. The BER may be referred to determine the number of program cycles of the memory cells.

The memory controller 2110 may detect degradation of each of the non-volatile memory devices 2120 through 212n. The memory controller 2110 may perform an operation of controlling the memory cells of each of the non-volatile memory devices 2120 through 212n to a first resistance state, an operation of controlling to read the programmed memory cells, an operation of receiving the BER of the memory cells generated during the read operation from a resistive memory device, and an operation of determining the number of program cycles of the memory cells corresponding to the BER with reference to the lookup table LUT.

Figure 22:
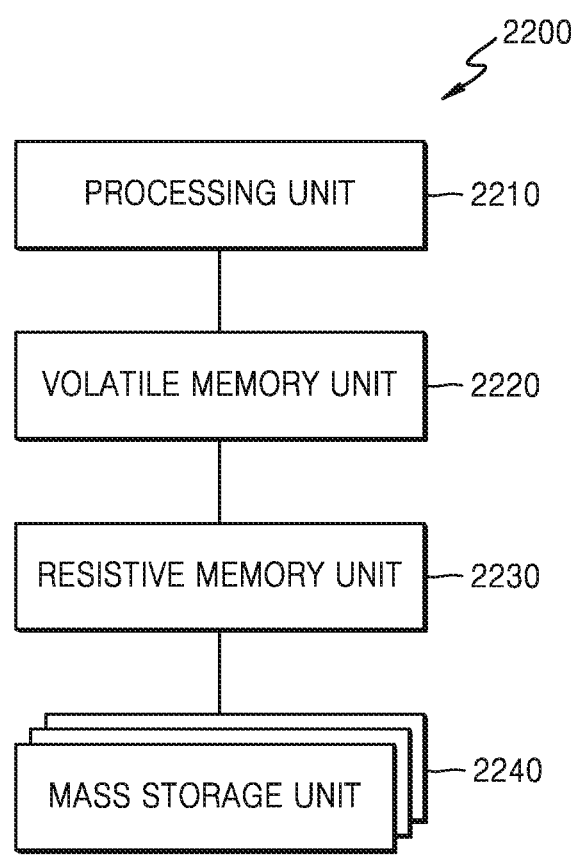
FIG. 22 is a block diagram illustrating a system to which a method performed by a memory controller of detecting degradation of a memory device is applied according to some example embodiments of the inventive concepts.

FIG. 22 is a block diagram illustrating a system 2200 to which a method performed by a memory controller of detecting degradation of a memory device may be applied according to some example embodiments of the inventive concepts. Such a system 2200 may be referred to herein as a computing device, an electronic device, or the like.

Referring to FIG. 22, the system 2200 may include a processing unit 2210 (also referred to herein as a processor, an instance of processing circuitry, or the like), a volatile memory unit 2220 (also referred to herein as a memory, a memory device, a storage device, or the like), a resistive memory unit 2230 (also referred to herein as a resistive memory device, a resistive storage device, a memory device, or the like), and a mass storage unit 2240 (also referred to herein as a mass storage device). The system 2200 may be a general purpose or special purpose computer system, such as a mobile device, a personal computer, a server computer, and programmable consumer electronics, a mainframe computer, and the like.

Functional units described in some example embodiments may be classified as modules for implementation independence. For example, a module may be implemented as a hardware circuit including a custom VLSI circuit or a ready-made semiconductor such as a gate array, a logic chip, a transistor, or other discrete components. The module may be implemented as a programmable hardware device, such as a programmable gate array, a programmable gate logic, a programmable gate device, and the like. The module may also be implemented in software configured as an executable code, an object, a procedure, or a function.

The processing unit 2210 may execute an operating system and a plurality of software systems and perform specific calculations or tasks. The processing unit 2210 may be a micro-processor or a central processing unit (CPU).

The volatile memory unit 2220 may refer to a medium that stores data shortly or temporarily, either as an operational memory or as a cache memory of the system 2200. The volatile memory unit 2220 may include one or more memory devices, e.g., a DRAM.

The resistive memory unit 2230 may be used to serve as a cache of the mass storage unit 2240. The resistive memory unit 2230 may be frequently accessed or may store some data of an application or an operating system. The resistive memory unit 2230 may include at least one memory device, e.g., PRAM. The resistive memory unit 2230 may be beneficial as the cache since the access of the resistive memory unit 2230 is much faster than when data is accessed through the mass storage unit 2240 such as a hard disk drive (HDD). The resistive memory unit 2230 may be implemented using the example embodiments shown in FIGS. 1 through 20.

The resistive memory unit 2230 may include a memory cell array including memory cells, a write/read circuit programming the memory cells to a first resistance state and reading the programmed memory cells, and a control circuitry outputting a BER of the memory cells generated during a read operation to the memory controller. The memory controller may determine the number of program cycles of the memory cells corresponding to the BER with reference to a lookup table.

The mass storage unit 2240 may be implemented as an HDD, a solid state drive (SDD), a peripheral component interconnect (PCIe) memory module, a non-volatile memory express (NVMe), or the like. Optionally, one or more tiers of the mass storage unit 2240 may be implemented as one or more network accessible devices and/or services, such as NVMe-over Fabrics (NVMe-oF) and/or Remote Direct Memory Access (RDMA), a server cluster(s), an application server(s), or a message server(s). The mass storage unit 2240 may refer to a storage medium on which the system 2200 is to store user data for a long period of time. The mass storage unit 2240 may store an application program, program data, and the like.

While the inventive concepts have been particularly shown and described with reference to embodiments thereof, it will be understood that various changes in form and details may be made therein without departing from the spirit and scope of the following claims.

What is claimed is:

1. A method of operating a memory controller, the memory controller configured to control a resistive memory device, the resistive memory device including a plurality of memory cells, the method comprising:
controlling the resistive memory device to program the plurality of memory cells to a first resistance state to establish a plurality of programmed memory cells;
controlling the resistive memory device to read the plurality of programmed memory cells;
receiving, from the resistive memory device, a bit error rate (BER) of the memory cells generated during a read operation; and
determining a quantity of program cycles of the memory cells based on the BER,
wherein the BER is generated based on controlling the resistive memory device to
applying a plurality of write currents to the plurality of memory cells to program the plurality of memory cells to the first resistance state and reading the plurality of programmed memory cells by using a read voltage, the plurality of write currents including a minimum write current necessary for the plurality of memory cells to change to the first resistance state, or
applying a write current to the plurality of memory cells to program the plurality of memory cells to the first resistance state and reading the plurality of programmed memory cells by using a plurality of read voltages, the write current including the minimum write current necessary for the plurality of memory cells to change to the first resistance state.

2. The method of claim 1, wherein the determining of the quantity of program cycles of the memory cells corresponding to the BER includes referring to a lookup table indicating a correlation between the BER and the quantity of program cycles.

3. The method of claim 2, wherein the lookup table is stored in read only memory (ROM) or a non-volatile memory.

4. The method of claim 1, wherein the controlling the resistive memory device to program the memory cells includes repeatedly programming the memory cells to the first resistance state.

5. The method of claim 1, wherein the first resistance state is a high resistance state of a plurality of resistance states.

6. The method of claim 5, wherein
a reset write current is applied to the memory cells to program the memory cells to reset data in the high resistance state, and
the reset write current is a minimum reset write current necessary for the memory cells to change to the high resistance state.

7. The method of claim 6, wherein the controlling of the resistive memory device to read the plurality of programmed memory cells includes reading the plurality of programmed memory cells according to a plurality of reset read voltages.

8. The method of claim 5, wherein
a plurality of reset write currents are applied to the memory cells to program the memory cells to reset data in the high resistance state, and
the plurality of reset write currents include a minimum reset write current necessary for the memory cells to change to the high resistance state.

9. The method of claim 1, wherein the first resistance state is a low resistance state of a plurality of resistance states.

10. A resistive memory device, comprising:
a memory cell array including a plurality of memory cells;
a write circuit configured to program the plurality of memory cells to a first resistance state to establish a plurality of programmed memory cells;
a read circuit configured to read the plurality of programmed memory cells; and
a control circuitry configured to output, to an outside of the resistive memory device, a bit error rate (BER) of the memory cells generated during a read operation, to enable a quantity of program cycles of the plurality of memory cells to be determined based on the BER,
wherein the BER is generated based on applying a plurality of write currents to the plurality of memory cells to program the plurality of memory cells to the first resistance state and reading the plurality of programmed memory cells by using a read voltage, the plurality of write currents including a minimum write current necessary for the plurality of memory cells to change to the first resistance state, or applying a write current to the plurality of memory cells to program the plurality of memory cells to the first resistance state and reading the plurality of programmed memory cells by using a plurality of read voltages the write current including the minimum write current necessary for the memory cells to change to the first resistance stat.

11. The resistive memory device of claim 10, wherein a correlation between the BER and the quantity of program cycles is stored in a lookup table, and the lookup table is stored in a memory controller configured to control the resistive memory device.

12. The resistive memory device of claim 10, wherein the first resistance state is a low resistance state that is reset data, or a high resistance state that is set data.

13. The resistive memory device of claim 10, wherein the first resistance state is one resistance state of a plurality of resistance states.

14. A memory system, comprising:

a resistive memory device, the resistive memory device including a memory cell array including a plurality of memory cells, a write circuit configured to program the plurality of memory cells to a first resistance state to establish a plurality of programmed memory cells, a read circuit configured to read the plurality of programmed memory cells, and a control circuitry configured to provide a bit error rate (BER) of the plurality of memory cells generated during a read operation; and a memory controller configured to control the resistive memory device, wherein the control circuitry is configured to provide the BER to the memory controller, wherein the BER is generated based on applying a plurality of write currents to the Plurality of memory cells to program the plurality of memo cells to the first resistance state and reading the plurality of programmed memory cells by using a read voltage, the plurality of write currents including a minimum write current necessary for the plurality of memory cells to change to the first resistance state, or apply a write current to the plurality of memory cells to program the plurality of memory cells to the first resistance state and reading the plurality of programmed memory cells by using a plurality of read voltages, the write current including the minimum write current necessary for the plurality of memory cells to change to the first resistance state.

15. The memory system of claim 14, wherein the memory controller is configured to refer to a lookup table indicating a correlation between the BER and a number of program cycles.

16. The memory system of claim 15, wherein the lookup table is stored in ROM or a non-volatile memory in the memory controller.

* * * * *